(12) United States Patent
Mizuguchi

(10) Patent No.: US 6,414,363 B1
(45) Date of Patent: Jul. 2, 2002

(54) SEMICONDUCTOR DEVICE WITH POWER CUTTING TRANSISTORS

(75) Inventor: Ichiro Mizuguchi, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/707,804

(22) Filed: Nov. 7, 2000

(30) Foreign Application Priority Data

Nov. 9, 1999 (JP) .......................................... 11-318814

(51) Int. Cl.⁷ ........................................... H01L 27/105
(52) U.S. Cl. ....................... 257/394; 257/392; 257/393; 327/408; 327/325
(58) Field of Search ................................ 257/392, 393, 257/394; 365/227; 327/109, 272, 325

(56) References Cited

U.S. PATENT DOCUMENTS 5,973,552 A * 10/1999 Allan .......................... 327/544

FOREIGN PATENT DOCUMENTS

TW 307042 6/1997 ............. H01L/27/10

OTHER PUBLICATIONS

Takashima et al, "Stand–by/Active Mode logic for Sub–1 V 1G/4Gb DRAMS" Proceedings of the VLSI Symposium Papers (1993) pp 83–84.

Horiguchi et al, "Switched–Source–Impedence CMOS Circuit for Low Standby Subthreshold current GIGA–Scale LSI's" Proceedings of the VLSI Symposium Papers (1993) pp 47–48.

* cited by examiner

Primary Examiner—Tuan H. Nguyen
Assistant Examiner—V Bhagawan
(74) Attorney, Agent, or Firm—Hayes Soloway P.C.

(57) ABSTRACT

A semiconductor device that operates at high speed using a low voltage power source, in which the output of each gate in the standby state is stable, and which has a delay time that is not affected by the frequency of the input signal.

TrQ1 to TrQ8, which form multiple stages of the inverters are designed to have a low threshold voltage in order to accomplish low voltage operation. When input node A is at "L" in the standby state, TrQ2, Q3, Q6, and Q8 which cut-off are connected to high threshold voltage TrQn1 and Qp1. In the standby state, power cutting TrQn1 and Qp1 cut off in accordance with chip selecting signals CS, /CS, thereby blocking the flow of sub-threshold current to TrQ1~Q8. Since TrQ1, Q4, Q5 and Q8 are not cut off at this time, the output potential of each inverter is stable. The number of transistors assigned to each power cutting transistor is determined based on the frequency of the input signal, so that only one transistor from among the transistors connected to TrQn1 and Qp1 will be ON at any given time.

7 Claims, 15 Drawing Sheets

SEMICONDUCTOR DEVICE WITH POWER CUTTING TRANSISTORS

BACKGROUND OF THE INVENTION

1. Field of the Invention

The present invention relates to a semiconductor device that has a low current consumption and performs high-speed operations using a low-voltage electrical source. More specifically, the present invention relates to a semiconductor device that is suitable for use in SRAM (static random access memory) and similar devices having a small standby current.

2. Description of the Related Art

In recent years, LSI (large-scale integrated circuits) and other such logic circuits have tended to operate using a low-voltage power source. The reason for this trend is that the withstanding voltage declines as the size of the transistors (abbreviated as "Tr" hereinafter) for forming logic circuits is reduced. Accordingly, the operating voltage must be reduced as a necessity. In addition, in order to install LSIs in portable information devices, it is essential for these LSI to be capable of being operated by the battery devices and therefore, these LSIs must be operated at low voltage region and in low power consumption.

However, there has also been a growing demand to increase the speed of operation of LSIs. Thus, it is not acceptable for the speed of operations to decrease in order to accomplish low voltage operation. In order to accomplish high-speed operation of a transistor while using a low voltage power source, a measure can be taken to reduce the amount of delay by lowering the transistor's threshold voltage (denoted as "Vt" hereinafter). Thus, as one example of conventional semiconductor devices, there is a design in which all of the circuits on a pass required to provide a high speed are formed of transistors having a low threshold voltage (referred to as "Conventional Example 1" hereinafter).

However, when the threshold voltage is reduced to enable high speed operation of the transistor, the transistor can no longer cut-off sufficiently. As a result, even in a no-bias state where the voltage between gate sources is "0", a leak current, referred to as a "sub-threshold current", will flow into the transistor. In the case of products typified by a low-power consuming SRAM in which there are many transistors and the standby current is very small, this sub-threshold current is too large to be ignored. However, if the threshold voltage of the transistor is raised in order to reduce the leak current, then a longer delay results, and an improvement in speed cannot be anticipated. Thus, in order to operate a semiconductor device at high speed with a low current consumption using a low voltage power source, it is necessary to satisfy the opposing requirements of reducing the transistor's threshold voltage and decreasing the leak current.

A design (referred to as "Conventional Example 2" hereinafter) such as shown in FIG. 10 in which improvements have been added to Conventional Example 1 may be considered as a semiconductor device in which the effects from sub-threshold current have been eliminated. The semiconductor device of Conventional Example 2 is based on the technical concept disclosed in Japanese Patent Application, First Publication No. Hei 6-208790, and realizes four stages of inverters in a dependent connection. In this semiconductor device, only the threshold voltage of transistors that are ON in the standby state, in which logic circuits are not operated, has been reduced. Note that the example shown in the figure assumes that the electric potential of input node A in the standby state is at "L" level.

More specifically, with respect to the transistors forming the first inverter stage which is connected to input node A, the p-type (p-channel) transistor (MOSFET: metal oxide field effect transistor) Q101 is a low Vt transistor having a low threshold voltage, while the n-type (n-channel) TrQ102 is a high Vt transistor having a high threshold voltage. Note that the term "high Vt" as employed here device that the threshold voltage is higher than that of TrQ101, and does not specifically mean a transistor in which the threshold voltage has been increased. Accordingly, if sub-threshold currents can be blocked, then TrQ102 can be formed using normal Vt transistors which do not change their threshold voltages. Since the distinction between n-type and p-type transistors is clear from the figures, they will not be discussed separately in the explanation that follows.

TrQ103~TrQ108 are identical to TrQ101 and TrQ102. TrQ103 and TrQ107 are the high Vt transistors and TrQ104 and TrQ108 are the low Vt transistors positioned at the second and final stages of inverters. The levels of the electric potentials at nodes A, A1, A2 and A3 in the standby state in FIG. 10 are "L", "H", "L", and "H", respectively. In other words, the transistors that cut-off in the standby state are TrQ102, TrQ103, TrQ106 and TrQ107. However, since these are all high Vt transistors, the subthreshold current is small. Accordingly, leak currents while in the standby state do not pose a problem as was the case in Conventional Example 1.

However, Conventional Example 2 has the following problems. Namely, high-speed operation is possible when the semiconductor device is in the active state for operating the internal logic circuits, since TrQ101, TrQ104, TrQ105, and TrQ108 are low Vt transistors as in Conventional Example 1. Accordingly, low Vt TrQ101 is ON when the input signal to input node A is falling, and the electric potential of node A1 changes at high speed as a result. Conversely, high Vt TrQ102 is ON when the input signal to node A is rising. In this case, the electric potential of node A1 changes at low speed as compared to the case where the signal is falling, since the gate capacitance of a high Vt transistor is greater than that of a low Vt transistor.

Accordingly, the aforementioned Japanese Unexamined Patent Application, First Publication No. Hei 6-208790 broadens the channel width of the high Vt transistors so that the electric potential of node A1 changes at high speed when there is a rising signal input to input node A. However, it is necessary to increase the size of the transistor in order to increase the channel width. Thus, there is an increase in chip size in a semiconductor device having a design such as conventional example 2.

A semiconductor device ("conventional example 3" hereinafter) such as shown in FIG. 11 may be considered as a device of eliminating the effects of the sub-threshold current that was cited in the conventional example 1. As in the case of conventional example 2, the semiconductor device according to conventional example 3 is an example of the application of the technology disclosed in Japanese Patent Application, First Publication No. Hei 8-228145 to a design in which there are four stages of inverters. In FIG. 11, all of the transistors for the logic circuits on the pass from input node A to the output node B which must be high speed are formed of low Vt transistors. Namely, the conventional example 3 is identical to the conventional example 1 in this regard. In FIG. 11, low Vt TrQ112, TrQ113, TrQ116, and TrQ117 are employed in place of the high Vt TrQ102, TrQ103, TrQ106 and TrQ107 that are shown in FIG. 10.

In addition, high Vt TrQ120 and TrQ121 are provided in FIG. 11. Of these, TrQ120 is inserted in between the electric potential of the electric source and the source terminal for TrQ101, etc. The ON/OFF state of TrQ120 is controlled by chip selecting signal /CS which is connected to the gate terminal. TrQ121 is inserted in between the grounding electric potential and the source terminal for TrQ112, etc., and its ON/OFF state is controlled by a chip selecting signal CS that is connected to the gate terminal. Note that chip selecting signal CS is set at "H" level when the semiconductor device is in the active state shown in the figure, and is set at "L" level when the semiconductor device is in the standby state. The symbol "/" which precedes the signal name indicates an inverted signal. Thus, chip selecting signal /CS is the inverted signal of chip selecting signal CS.

When the semiconductor device shown in FIG. 11 is in the standby state and chip selecting signals CS and /CS are at "L" and "H" levels respectively, then both TrQ120 and TrQ121 are cut-off. As a result, the sub-threshold current that flows to the low Vt transistors that form the inverter is stopped by these high Vt transistors. On the other hand, when the semiconductor device is in the active state and chip selecting signals CS and /CS are at "H" and "L" levels respectively, then TrQ120 and TrQ121 both enter the ON state. In this case, the sub-threshold current is sufficiently low enough when compared to the operating current that it may be ignored. In the explanation that follows below, transistors like TrQ120 and TrQ121 which block the sub-threshold current will be referred to as "power cutting transistors".

The semiconductor device of the conventional example 3 has the following problems however. Namely, in the circuit design of the conventional example 3, when the semiconductor device is in the standby state, a high impedance state results because the supply of electric potential from TrQ117 and TrQ108 to output node B is blocked. For this reason, the electric potential output from the semiconductor device becomes unstable. Therefore, in order to stabilize the electric potential of output node B in the semiconductor device of Conventional Example 3, it is necessary to provide a design that maintains the state that is present immediately before the device shifts from active to standby state. This is accomplished by providing a maintaining device such as a latch or flip-flop. However, the circuit design in the semiconductor device of Conventional Example 3 becomes complicated in this case, and the chip size is increased as a result.

The design shown in FIG. 12 may be considered as a semiconductor device that resolves these problems (referred to as "Conventional Example 4" hereinafter). This is the semiconductor device disclosed in such references as the aforementioned Japanese Unexamined Patent Application, First Publication No. Hei 6-208790; Switched-Source-Impedance CMOS Circuit for Low Standy Subthreshold Current Giga-Scale LSI's, Masashi Horiguchi et. al, Proceeding of the VSLI symposium papers, pp. 47–48 (1993); and Standby/Active Mode Logic for Sub-1 V 1G/4Gb DRAMS, Daisaburo Takashima et. al, Proceeding of the VSLI symposium papers, pp. 83–84 (1993).

FIG. 12 differs from FIG. 11 on the following point. Namely, of the n-type and p-type transistors forming each of the inverters in FIG. 12, only one of the transistors that cuts-off in the standby state is connected to TrQ120 or TrQ121. As a result, the sub-threshold current that is problematic in the standby state does not flow to these transistors. Note that FIG. 12 also assumes the case where the electric potential of input node A in the standby state is at "L" level. Namely, only TrQ112, TrQ113, TrQ116 and TrQ117 are cut-off in the standby state.

For this reason, the source terminals of TrQ101 and TrQ105 are directly connected to the power source electric potential, rather than being connected to the source terminal of TrQ120. In addition, in the same figure, the source terminals of TrQ104 and TrQ108 are directly connected to the grounding electric potential, rather than to the drain terminal of TrQ121. As a result, the "H", "L", "H" and "L" levels from, respectively, TrQ101, TrQ104, TrQ105, and TrQ108 which are in the ON state continue to be supplied to nodes A1, A2, A3 and B, even when the device is in the standby state. Thus, the electric potential of output node B does not become unstable in Conventional Example 4, and it is not necessary to provide a maintaining device in front of output node B as was the case with Conventional Example 3.

However, the semiconductor device of this conventional example 4 has the following problems. Namely, in the design of Conventional Example 4, the delay time will differ depending on the frequency of the signal input to the semiconductor device. Specifically, the greater the number of high frequency signals (also referred to as a "short pulse" below) that are input, the larger the increase in the delay time from input node A to output node B as compared to the case where low frequency signals are input to input node A. This point will be discussed further below.

The cycle of the signal input to input node A is designated as time Tcycle, and the propagation delay time until this input signal is output from output node B is designated as time Tpd as shown in FIGS. 13A–13C. Note that the symbols VA and VB in this figure are the electric potentials of input node A and output node B respectively. Symbol In is the value of the current flowing to TrQ120. As shown by time t101~t103, a signal is input for a low frequency signal that satisfies cycle T1 (=Tcycle)≧time Tpd.

If a rising input signal is considered in this case for example, then TrQ112, TrQ113, TrQ116, and TrQ117 in FIG. 12 are sequentially turned ON, and, in parallel, TrQ101, TrQ104, TrQ105, and TrQ108 are sequentially turned OFF. Note that this also applies to the case where the input signal is falling. Namely, in this case, the ON/OFF state of each transistor is the opposite of the case where the signals are rising. Further, once time Tpd has passed from time t101 to time t102, then the signal input to input node A is output from output node B. Accordingly, if an input signal for cycle T1 is supplied thereafter, then a rise in the input signal during the next cycle appears at time t103. The events as described above are repeatedly carried out.

In summary, when a low frequency input signal is provided, only one of the four n-type and p-type low Vt transistors is charged and discharged at any time t considered. Accordingly, for example, the value In of the current flowing in TrQ120 changes at roughly equal time intervals to match the charge and discharge of the n-type transistor, as shown in FIGS. 13A–13C. The current value In at peak is roughly the same. Note that FIGS. 13A–13C shows the case where there are more stages of inverters connected than in the semiconductor device shown in FIG. 12, and depicts the case in which current In repetitively changes.

On the other hand, as shown by times t103~t104 in FIGS. 13A–13C, a short pulse satisfying cycle Ts (=Tcycle)<time Tpd was input as a high frequency signal. In this case, the input signal which was rising at time t103 is output from output node B at time t105. Accordingly, this signal is still propagating inside the semiconductor device at time t104. Thus, when the input signal again rises at time t104 and is input to the initial inverter, two low Vt transistors are simultaneously charged and discharged in the semiconductor device. For this reason, the current that flows to TrQ120 for example, increases as compared to when the frequency of the input signal is low, as shown by times t104–t105 in FIGS. 13A–13C. Thus, the rise and fall in the electric potential at the source terminals for TrQ112, 113, 116 and 117 (i.e., the electric potential at nodes CN and CP) becomes larger, and the propagation delay time Tpd increases as a result.

FIGS. 14 and 15 show the results of simulations performed by the present inventor employing 24 stages of inverters. FIG. 14 shows the case wherein a low frequency input signal was provided. The notation "IN" shown in the figure is a signal waveform that is input to an input node A. The rising portion of this waveform is a long period signal that can be illustrated in the figure. In addition, "A1", "A9" and "A17" are the respective signal waveforms output from the first, 9th and 17th stages of inverters.

Note that in actuality these signals are inverted with respect to input signal IN. However, for convenience, they have been fitted to the depiction of input signal IN in the figure. The notation "OUT" shown in the figure is a signal waveform output from output node B. As may be understood from the figure, the delay time in this case is approximately 7.2 seconds. In addition, "Ip" and "In" in the figure indicate the signal waveform of the current flowing to TrQ120 and TrQ121, respectively. "Ip" and "In" change corresponding to the sequential propagation of the input signal through each stage of the inverters. The peak of the current value is roughly the same at each stage of inverters.

On the other hand, FIG. 15 shows the case where a short pulse is provided as an input signal. "IN" in the figure is the input signal waveform in the next cycle that follows the previously input [IN]. Similarly, [A1]' and [A9'] are the signal waveforms respectively output from the first and 9th stages of inverters corresponding to input signal IN'. In this case, the cycle of input signal IN is 4 ns, which is relatively short as compared to the 7 ns propagation delay time of the semiconductor device. For this reason, from the time at 4 ns when input signal IN' is input, until the time at 7.5 ns when input signal IN is output from output node B ("OUT" in the figures), the absolute value of currents In and Ip is increasing as compared to when outside this time range. As a result, approximately 7.5 ns are required until input signal IN is output as output OUT. Thus, the propagation delay time Tpd has increased about 0.3 ns (or approximately 5%) as compared to the case in FIG. 14.

SUMMARY OF THE INVENTION

The present invention has been carried out in consideration of the above-described points, and has as its objective the provision of a semiconductor device which can operate at high speed using low power voltage, has low power consumption, does not require additional circuits in order to stabilize the electric potential in the standby state, and which is not effected by a delay time that depends on the frequency of the input signal.

In order to resolve the above-described problems, the present invention according to the first aspect is a semiconductor device that is provided with power cutting transistor for blocking leak currents from the logic circuit transistors forming a logic circuit that cut off when the circuit is in the standby state, in which the threshold voltage of the logic circuit transistors is lower than the threshold voltage of the power cutting transistors. This semiconductor device is characterized in that a plurality of these power cutting transistors is provided for each type of transistor, and several power cutting transistors are assigned by transistor type to the transistors of the logic circuit.

The invention according to the second aspect is characterized in that in the invention according to the first aspect, the various power cutting transistors are assigned to each part of the circuit so that the number of logic circuit transistors charging and discharging simultaneously is a maximum of one.

The invention according to the third aspect is characterized in that in the invention according to the first aspect, the one to a plurality of logic circuit transistors that are assigned to each power cutting transistor is determined according to the minimum cycle during which an input signal supplied to the logic circuit can be taken up.

The invention according to the fourth aspect is characterized in that in the invention according to the third aspect, the portion of the circuit that is formed of the one to a plurality of logic circuit transistors that are assigned to each power cutting transistor is determined so that the delay time Td for that portion of the circuit satisfies Tcyc≧Td, where Tcycle is the minimum cycle for obtaining the input signal.

The invention according to the fifth aspect is characterized in that in the invention according to the first aspect, the number of logic circuit transistors assigned per power cutting transistor is reduced as the output stage is approached, as compared to when near the input stage of the logic circuit.

The invention of the sixth aspect is characterized in that in the invention according to one of the first aspect, the power cutting transistors are turned ON and OFF together according to a chip selecting signal for setting the logic circuit to the active or standby state, and in that a buffering device is inserted in between the power cutting transistors for buffering the chip selecting signal as the chip selecting signal is being distributed to each power cutting transistor.

The invention of the seventh aspect is characterized in that a semiconductor memory device for recording data in memory cells that form a memory cell array is provided with a buffering device for buffering an address signal input from the outside; a row decoding device for decoding the row address included in the address signal and activating a word line in the memory cell array, while also detecting a transformation in the row address, and outputting a row address transformation detecting signal; a column decoding device for decoding a column address included in the address signal and generating a selecting signal for the bit line in the memory cell array, while also detecting a transformation in the column address and outputting a column address transformation detecting signal; a sensing device for sensing the electric potential which is generated by reading out on the bit line the data in the memory cell that is designated by the address signal, and outputting the data; an input/output data controlling device for giving and receiving data between the sensing device and the outside; and a timing signal generating device for generating a timing signal for operating the row decoding device, the column decoding device and the sensing device, based on the row address transformation detecting signal and the column address transformation detecting signal; wherein at least one of the aforementioned device is formed of a semiconductor device according to one of claims 1 through 6.

DETAILED DESCRIPTION OF THE PRESENT INVENTION

Preferred embodiments of the present invention will now be explained with reference to the figures. The operational principle of the semiconductor device according to the present invention will be explained first, followed by an explanation of the various embodiments using specific circuit structures.

[Principle of the Present Invention]

Figure 11:
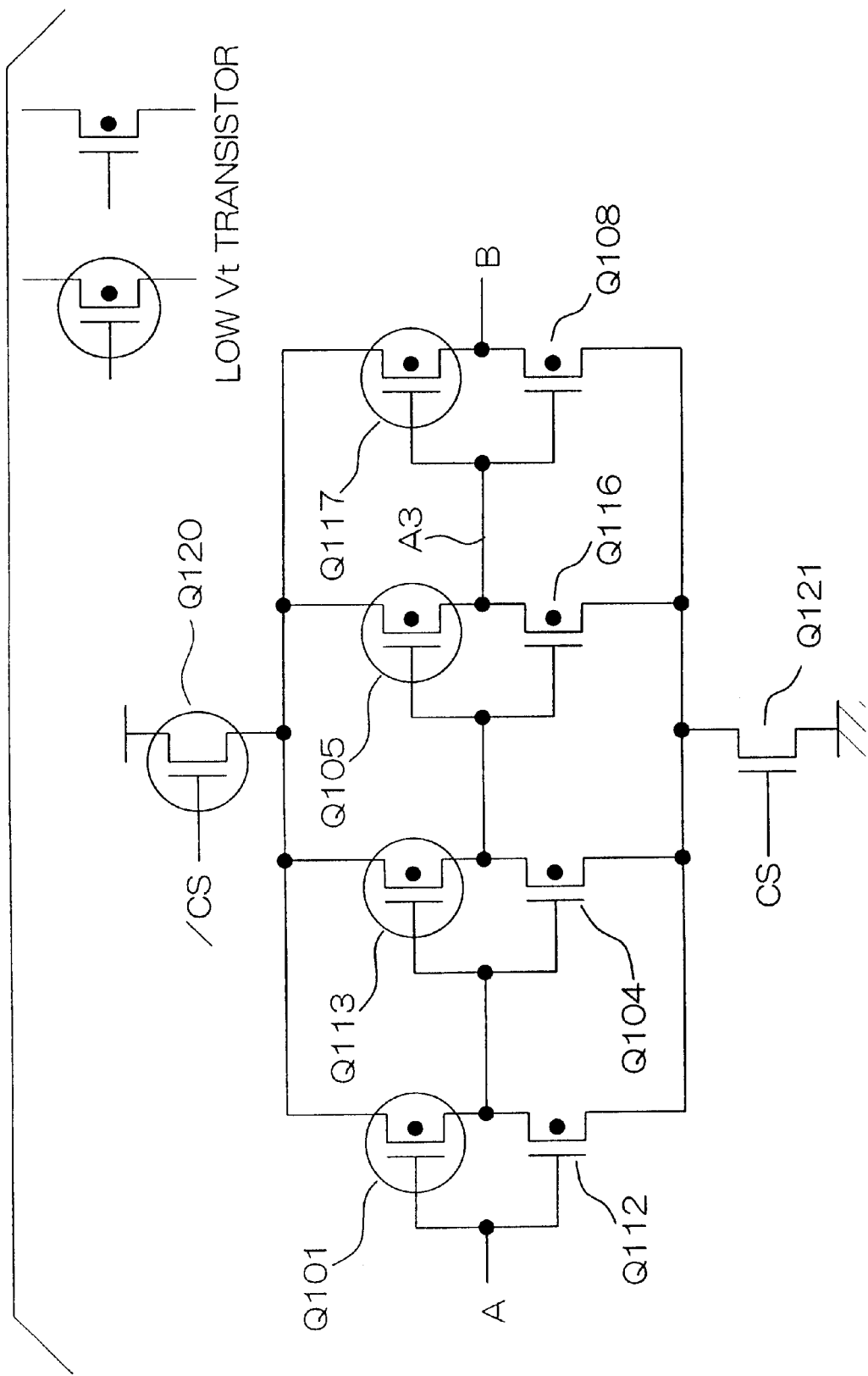
FIG. 11 is an example of the design of a semiconductor device according to the third example of the conventional art, and is a circuit diagram of a semiconductor device in which four stages of inverters are dependently connected.
Figure 12:
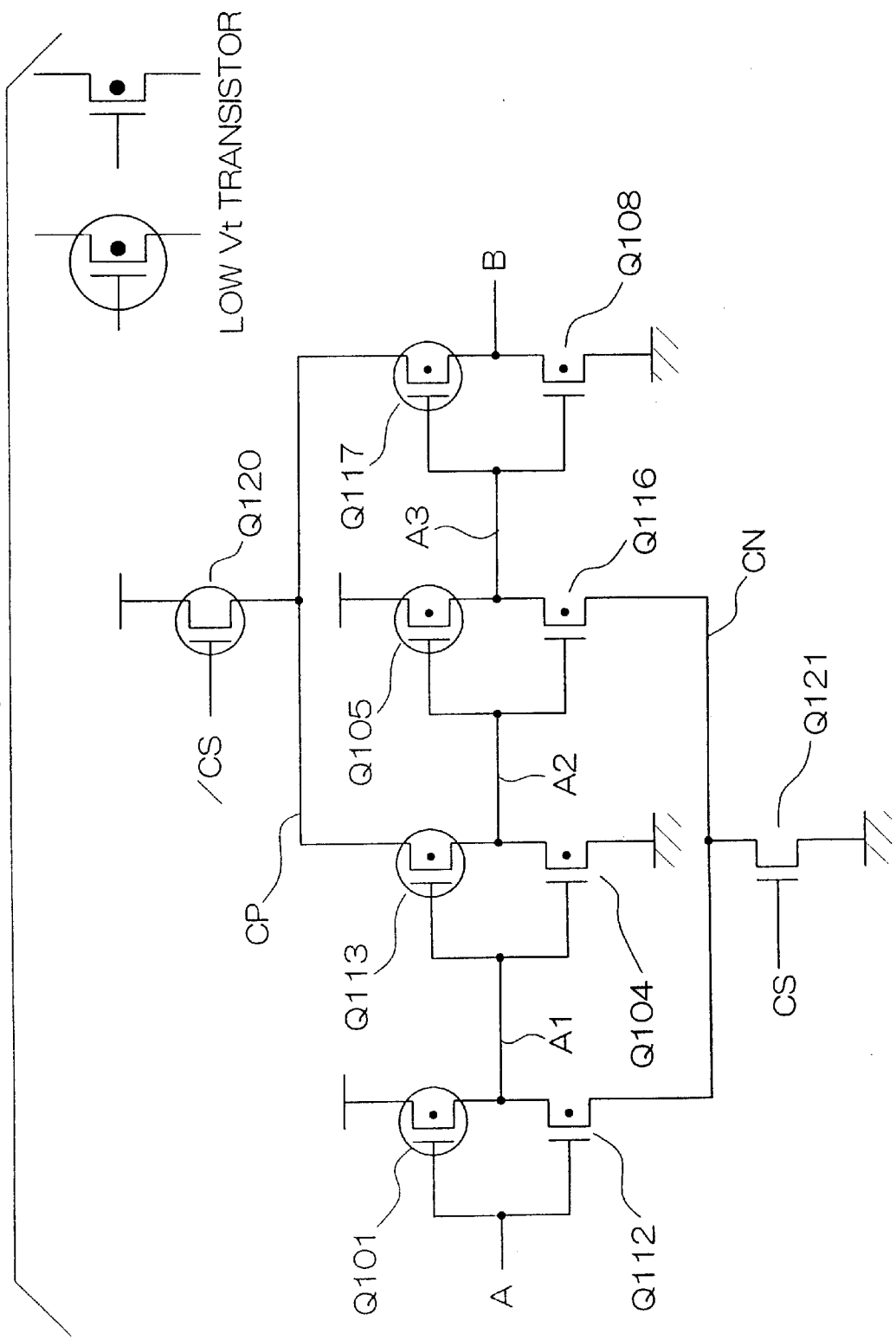
FIG. 12 is an example of the design of a semiconductor device according to the fourth example of the conventional art, and is a circuit diagram of a semiconductor device in which four stages of inverters are dependently connected.
Figure 13A:
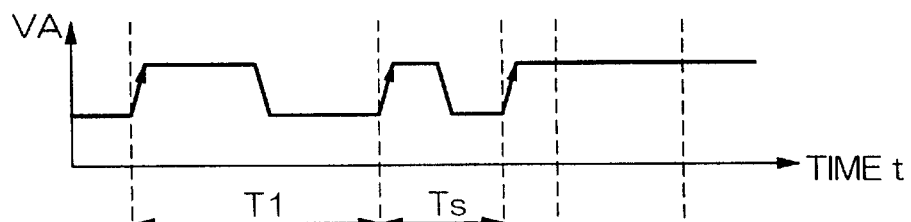
FIGS. 13A–13C show the case where the current flowing through the power cutting transistor is increasing when a short pulse is input into the semiconductor device in the preceding fourth example of the conventional art.
Figure 13B:
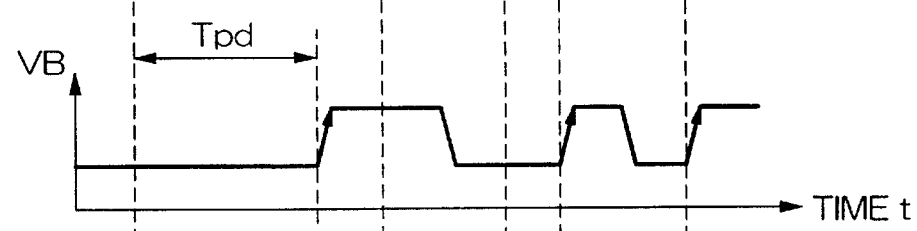
Figure 13C:
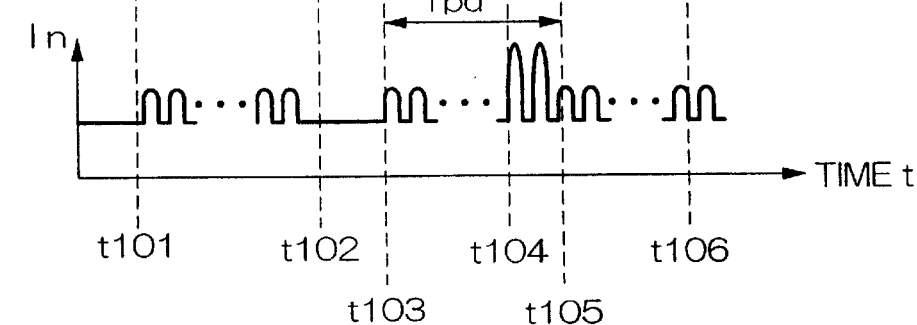

In a conventional semiconductor device such as shown in FIGS. 11 and 12, all of the low Vt n-type and p-type transistors inside the semiconductor device are assigned to power cutting transistors that are for n-type and p-type transistors. In contrast, in the semiconductor device of this embodiment, a plurality of power cutting transistors are provided for the n-type and p-type transistors respectively (i.e., for each transistor type), and the low Vt transistors in the semiconductor device are assigned to this plurality of power cutting transistors.

More specifically, the low Vt transistors are assigned to the power cutting transistors so that only one transistor from among the low Vt transistors assigned to each power cutting transistor is charging or discharging at any point in time. To accomplish this, it is necessary for the transistors to be assigned according to the frequency (cycle) of the signal that was input into the semiconductor device. Because the frequency of the input signal is not limited to a fixed value such as a clock signal, in this case, it is necessary to determine the assignment of the power cutting transistors based on the maximum frequency that may be anticipated for the input signal.

Here, time Tcycle designates the cycle of the input signal supplied to the logic circuit to be made faster, and time Td designates the propagation delay time of this logic circuit. The transistors forming the logic circuit may be assigned to the power cutting transistors so as to satisfy time Tcycle≧time Td. In this way, input signals in a given cycle are input to the logic circuit after the changes in the input signal during preceding cycle are output from the logic circuit. As a result, two or more transistors are not simultaneously charging and discharging in this logic circuit. Thus, the value of the current in the node connecting a power cutting transistor and the logic circuit does not rise and fall, and there is no increase in the propagation delay time of the logic circuit.

Figure 1:
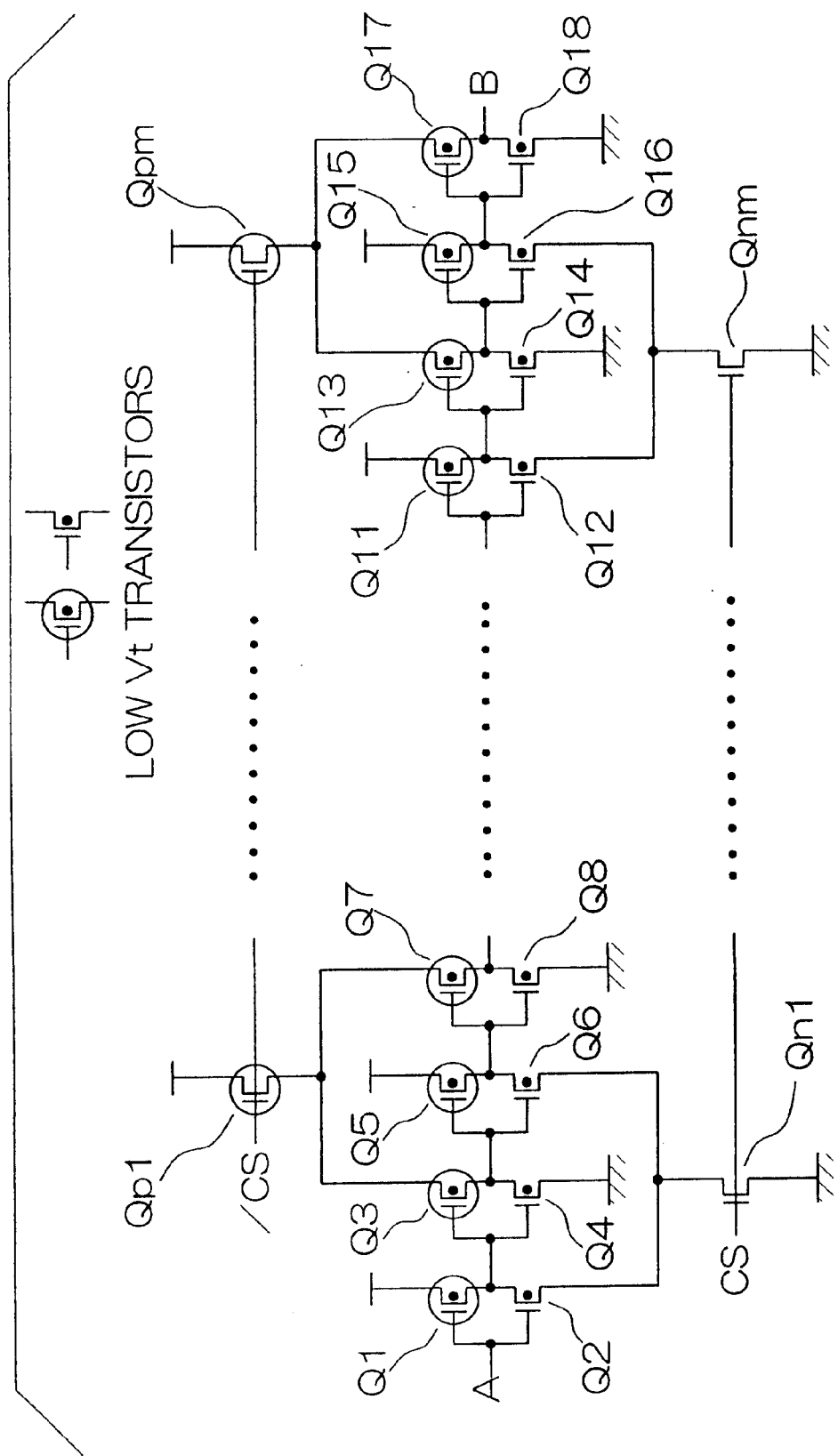
FIG. 1 is an example of the design of a semiconductor device according to a first embodiment of the present invention, and is a circuit diagram of a semiconductor device in which multiple stages of inverters are dependently connected.

In a logic circuit formed only of a CMOS (complementary MOS) inverter such as shown in FIG. 1 below, the n-type and p-type transistors are paired, and simultaneously charge and discharge. For this reason, an equal number of n-type and p-type transistors are assigned to a given power cutting transistor. However, in the usual logic circuit, various gates such as NAND and NOR gates, as well as latches, flip-flops and the like are present in addition to the inverter. Accordingly, it is necessary to determine the number of p-type transistors and the number of n-type transistors assigned to the power cutting transistors respectively, according to the logic circuits to which these transistors are allocated.

For example, in the case of a non-synchronous type memory, it is possible that the short pulse due to a noise and the like is input into an input-stage logic circuit in which address signals or data are supplied from the outside. Thus, the number of transistors allocated to the power cutting transistor is reduced. When the logic circuit is a synchronous type circuit which operates in synchronism with a clock signal, for example, for the portion of the circuit disposed at stages subsequent to the register, the number of the transistors allocated to the power cutting transistor are determined based on the cycle of the clock signal, since a signal synchronized with the clock signal is supplied from the register. In addition, high frequency components such as noise that are included in an input signal supplied at the logic circuit's input stage are almost entirely eliminated by the time the signal reaches the portion of the circuit near the logic circuit's output stage, due to resistance and capacitance components that are present between the input stage and the portion of the circuit near the output stage. For this reason, more transistors are assigned to each power cutting transistor here as compared to when at the input stage.

If assignment of transistors is performed so that the number of simultaneously charging and discharging transistors from among the group of transistors assigned to each power cutting transistor is always one, then it is possible to minimize the increase in the delay time of the logic circuit. Accordingly, from the perspective of delay time alone, this design is optimal, and can be accomplished by assigning exclusive power cutting transistors for each transistor. In this case, however, it is necessary to have the same number of power cutting transistors as the number of transistors that form the logic circuit, leading to an increase in the surface area on the chip that is used for this purpose.

In other words, it is not absolutely essential in the present invention that the number of transistors simultaneously charging and discharging from among the group of transistors assigned to each power cutting transistor always be one. Rather, it is acceptable simply that the change in the delay time be smaller than in conventional semiconductor devices. Take, for example, a conventional semiconductor device in which there are 50 transistors that simultaneously charge and discharge. An increase in the delay time can be controlled if assignment of transistors is performed so that less than 50 transistors are simultaneously charging and discharging. In summary, the number of any one of the p-type transistors or the n-type transistors can be determined by dividing the logic circuits into a plurality of groups and by assigning each group to either one of the p-type or n-type transistors.

[First Embodiments]

FIG. 1 is a circuit diagram showing the structure of a semiconductor device according to the present embodiment. The circuit in FIG. 1 is a logic circuit in which multiple stages of inverters are dependently connected. TrQ1~TrQ8 and TrQ11~TrQ18 in the figure are all low Vt transistors, and form a logic circuit extending from input node A to output node B. TrQn1~TrQnm and TrQp1~TrQpm (where m is a natural number which is 2 or greater) are all high Vt power cutting transistors which have a threshold voltage that is set to be higher than the aforementioned low Vt transistors. Note that this figure shows only the first four stages of inverters after node A and the last four stages of inverters before output node B. This embodiment considers that the electric potential of input node A when the semiconductor device is in a standby state is at "L" level.

In this embodiment, the propagation delay time per stage of inverters is 1 ns each, for example, and the maximum frequency of the input signal supplied to input node A is 200 MHz (i.e., cycle Tcyc=5 ns). In this case, it is acceptable to provide one power cutting transistor for every fourth stage of inverters. In other words, of the transistors that cut-off in the standby state in this embodiment, TrQn1 is provided in between the grounding electric potential and the source terminal for TrQ2 and TrQ6, and TrQp1 is disposed in between the power source electric potential and the source terminals for TrQ3 and TrQ7. In other words, two low Vt transistors are assigned to each n-type and p-type power cutting transistor.

Chip selecting signal CS is supplied to the gate terminal of TrQn1, while chip selecting signal /CS is supplied to the gate terminal of TrQp1. TrQnm and TrQpm are identical to TrQn1 and TrQp1. In addition, chip selecting signal CS is sequentially connected to TrQn1, . . . TrQnm, and chip selecting signal /CS is sequentially connected to TrQp1, . . . TrQpm. Note that in this embodiment as well, chip selecting signals CS and /CS are at "L" and "H" level in the standby state and, conversely, are at "H" and "L" level in the active state, respectively.

The operation of a semiconductor device according to the above described design will now be explained. When the semiconductor device is in the active state, chip selecting signals CS and /CS are at "H" and "L" level respectively, and the transistors TrQn1~TrQnm and TrQp1~TrQpm employed for power cutting are all ON. As a result, power is supplied to the low Vt transistors forming the logic circuit, the input signal provided to input node A is sequentially inverted at each inverter stage, and is finally output from output node B.

Here, the propagation delay time of the logic circuit assigned to power cutting transistors TrQn1 and TrQp1 is 4 ns, for example. Thus, when the input signal in a given cycle is input to node A, this input signal is output from TrQ7 and TrQ8 after 4 ns. Then, after an additional 1 ns has passed, the input signal in the next cycle is supplied to input node A. Accordingly, the two low Vt transistors assigned to TrQn1 and TrQp1 respectively do not simultaneously operate. Thus, the electric potential at the drain terminal for the power cutting transistors does not rise and fall, making it possible to control the increase in the delay time as compared to the conventional semiconductor device. The equivalent operation is carried out for the circuits disposed to the stages after TrQ7 and TrQ8. In addition, because the logic circuit is composed of only low Vt transistors, high-speed operation and low power consumption can be achieved for all of the inverters.

When the semiconductor device shifts to the standby state, input node A becomes "L" level, and all of the low Vt transistors assigned to the power cutting transistor are cut-off. However, since chip selecting signals CS and /CS become "L" and "H" level and all of the power cutting transistors are cut-off, the sub-threshold current flowing to the cut-off low Vt transistors is blocked at this time. Further, low Vt transistors not connected to the power cutting transistors are all ON, so that these transistors supply the output electric potential of each of the inverters.

Figure 14:
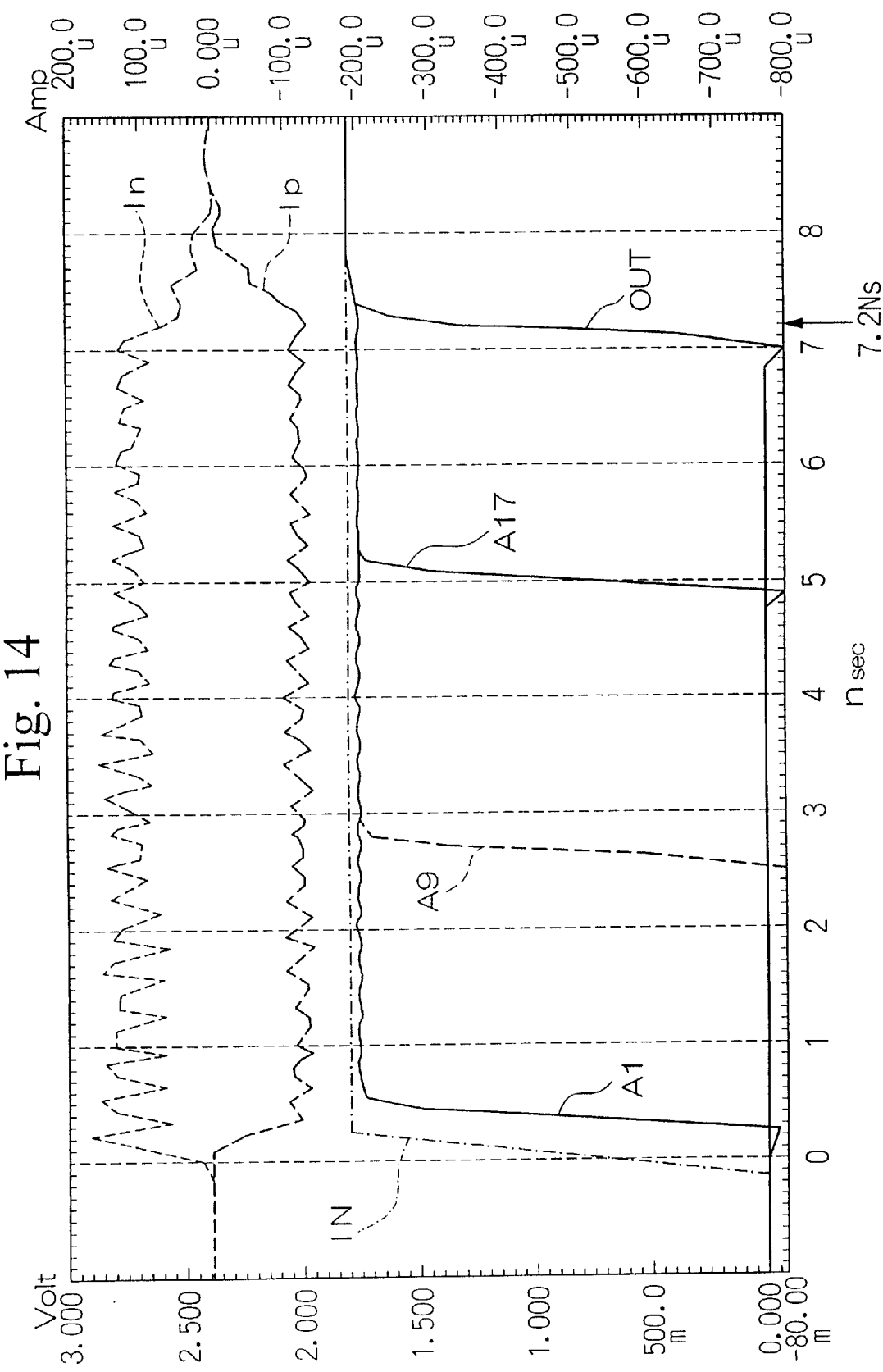
FIG. 14 is a graph showing the appearance when the input signal is delayed at each inverter stage in the case where a low frequency signal is input to a multiply connected inverter. This figure also shows the results obtained from a simulation of the current flowing through the power cutting transistor.
Figure 15:
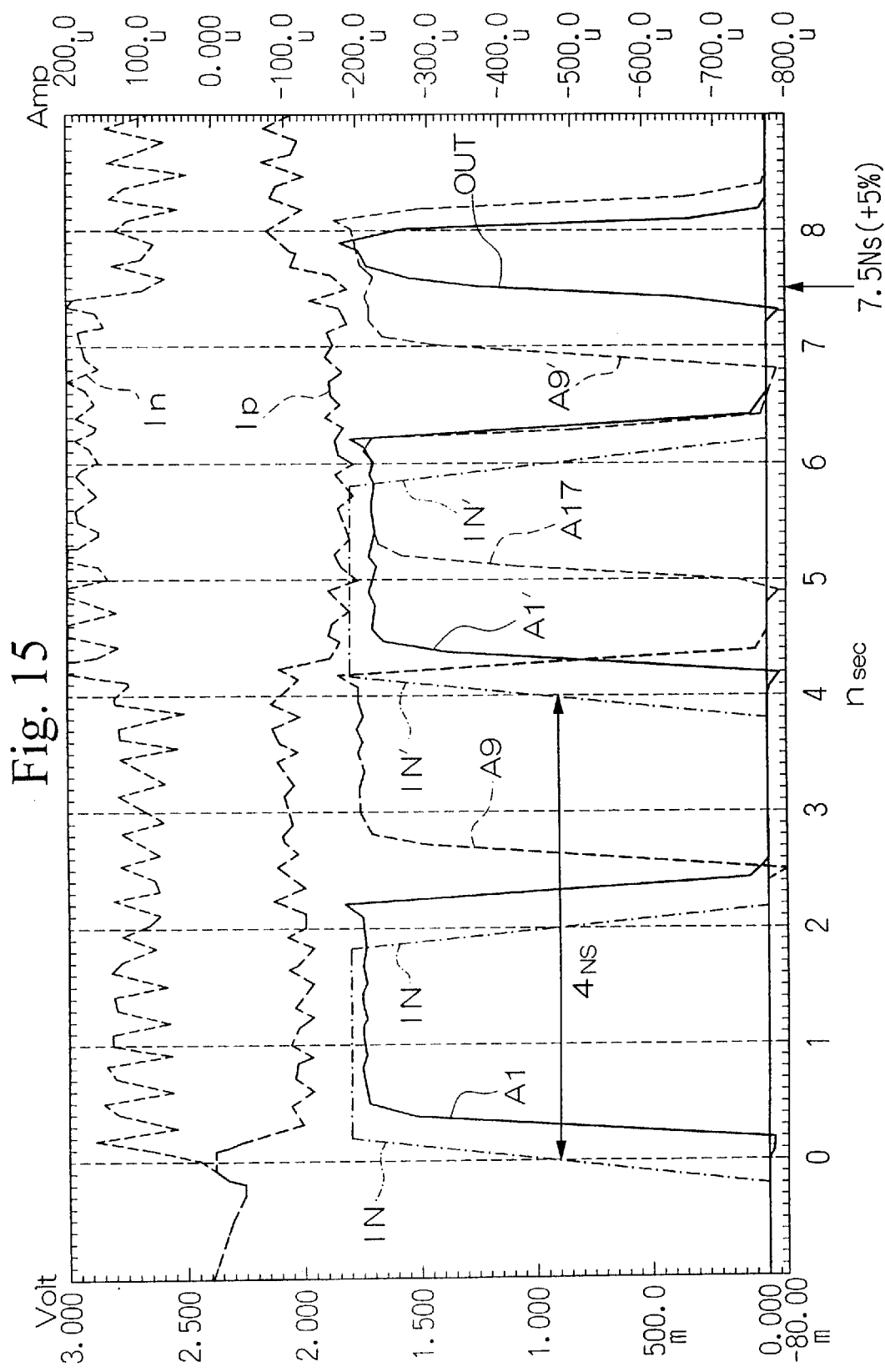
FIG. 15 is a graph showing the appearance when the input signal is delayed at each inverter stage in the case where a high frequency signal is input to a multiply connected inverter. This figure also shows the results obtained from a simulation of the current flowing through the power cutting transistor.

In this way, even when a short pulse is input in this embodiment, the current value flowing to the power cutting transistor increases, so that there is no increase in the delay time of the logic circuit. Thus, as explained with reference to FIGS. 14~15, by applying this embodiment to a logic circuit having 24 stages of inverters, the propagation delay time can be shortened by about 5% as compared to the conventional art. In the semiconductor device according to this embodiment, the delay time can be held constant without relying on the width of the input pulse. Further, since the logic circuits are formed only of low Vt transistors in this embodiment, it is possible to carry out high-speed operations at low energy consumption using a low voltage power source. In addition, sub-threshold current in the standby state is blocked by the power cutting transistor, so that the standby current can be held to an extremely low value. Moreover, since power cutting transistors are not connected to transistors that are cut-off in the standby state, the level of output node B does not become unstable.

Note that the preceding explanation assumed that the level of input node A in the standby state was "L", however, the converse situation is of course also acceptable. Namely, in the case where the level of input node A in the standby state is "H", then the source terminal for TrQ1, TrQ5, . . . TrQ11, TrQ15 may be connected to the drain terminal for TrQp1, . . . TrQm; the source terminal for TrQ4, TrQ8, . . .

TrQ14, TrQ18 may be connected to the drain terminal for TrQn1, . . . TrQnm; the source terminal for TrQ2, TrQ6, . . . TrQ12, TrQ16 may be grounded; and the source terminal for TrQ3, TrQ7, . . . TrQ13, TrQ17 may be connected to the power source electric potential.

[Second Embodiment]

Figure 2:
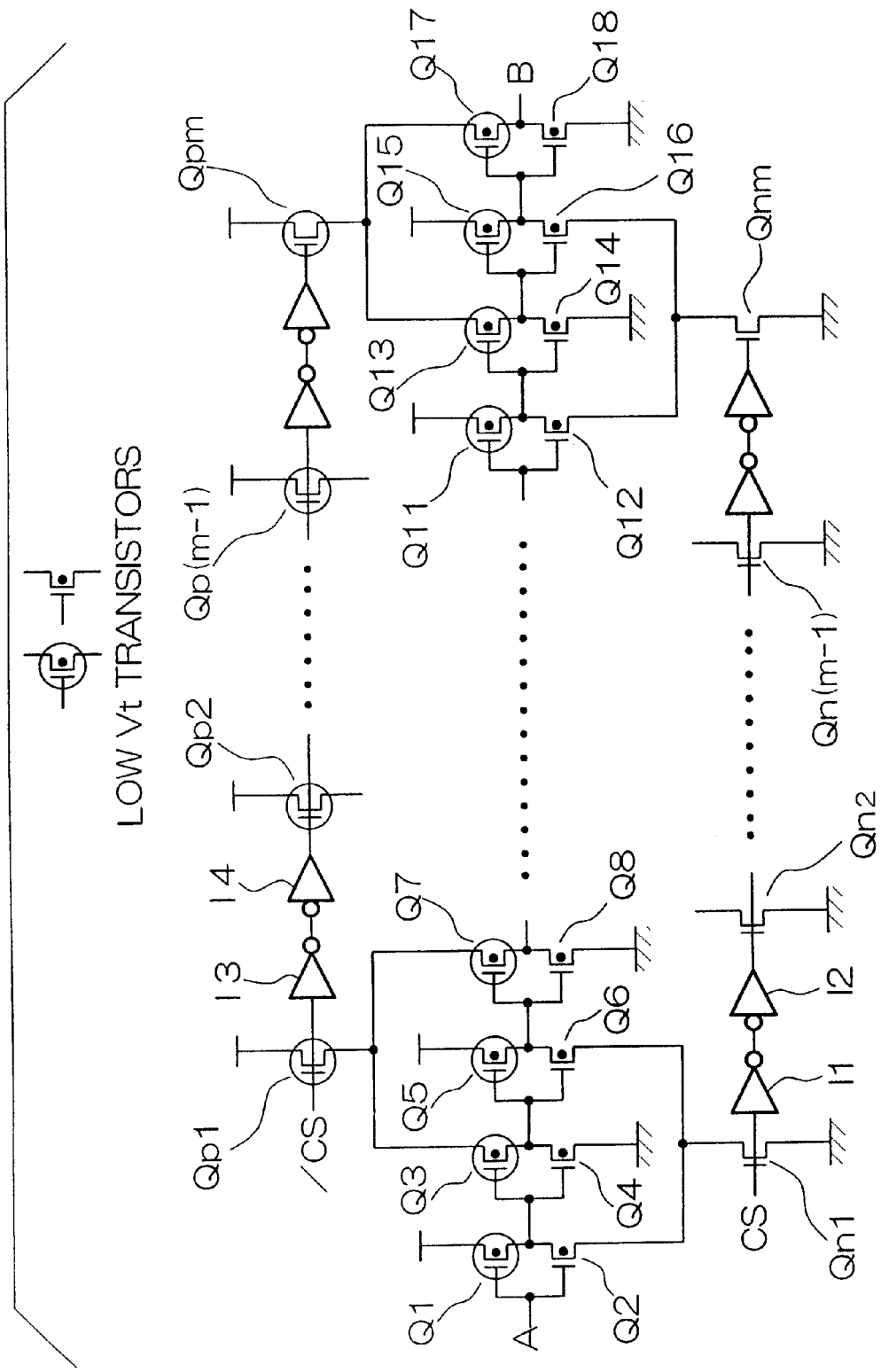
FIG. 2 is an example of the design of a semiconductor device according to a second embodiment of the present invention, and is a circuit diagram of a semiconductor device in which multiple stages of inverters are dependently connected.

FIG. 2 is a circuit diagram showing the structure of a semiconductor device according to the present embodiment. Structural elements that are the same as those shown in FIG. 1 have been assigned the same numerical symbol. In the first embodiment, chip selecting signal CS was supplied to all of the gate terminals of power cutting transistors TrQn1~TrQnm, and chip selecting signal /CS was supplied to all of the gate terminals of power cutting transistors TrQp1~TrQpm. In other words, in the first embodiment, all of the power cutting transistors are driven by drivers (omitted from the figures) that are provided respectively to chip selecting signals CS, /CS.

In contrast, in this embodiment, respective buffers have been added in between the gate terminals of the power cutting transistors that were connected in common in the first embodiment. For example, a buffer, in which inverters I1 and I2 are dependently connected, is inserted in between the gate terminals of power cutting transistors TrQn1 and TrQn2. Similarly, for example, a buffer, consisting of inverters I3 and I4, is inserted in between the gate terminals of power cutting transistors TrQp1 and TrQp2.

Note that TrQn2 and TrQp2 correspond to a logic circuit with four stages of inverters that is positioned after TrQ1~TrQ8. Similarly, TrQn(m−1) and TrQp(m−1) correspond to a logic circuit with four stages of inverters that is positioned before TrQ11~TrQ18. These, however, are omitted from FIG. 1. Further, since inverters I1~I4 do not need to be operated at high-speed, they may be formed of normal Vt transistors rather than low Vt transistors.

By buffering chip selecting signals CS,/CS in between adjacent power cutting transistors, the load capacity of chip selecting signals CS,/CS can be reduced as compared to the first embodiment.

[Third Embodiment]

Figure 3:
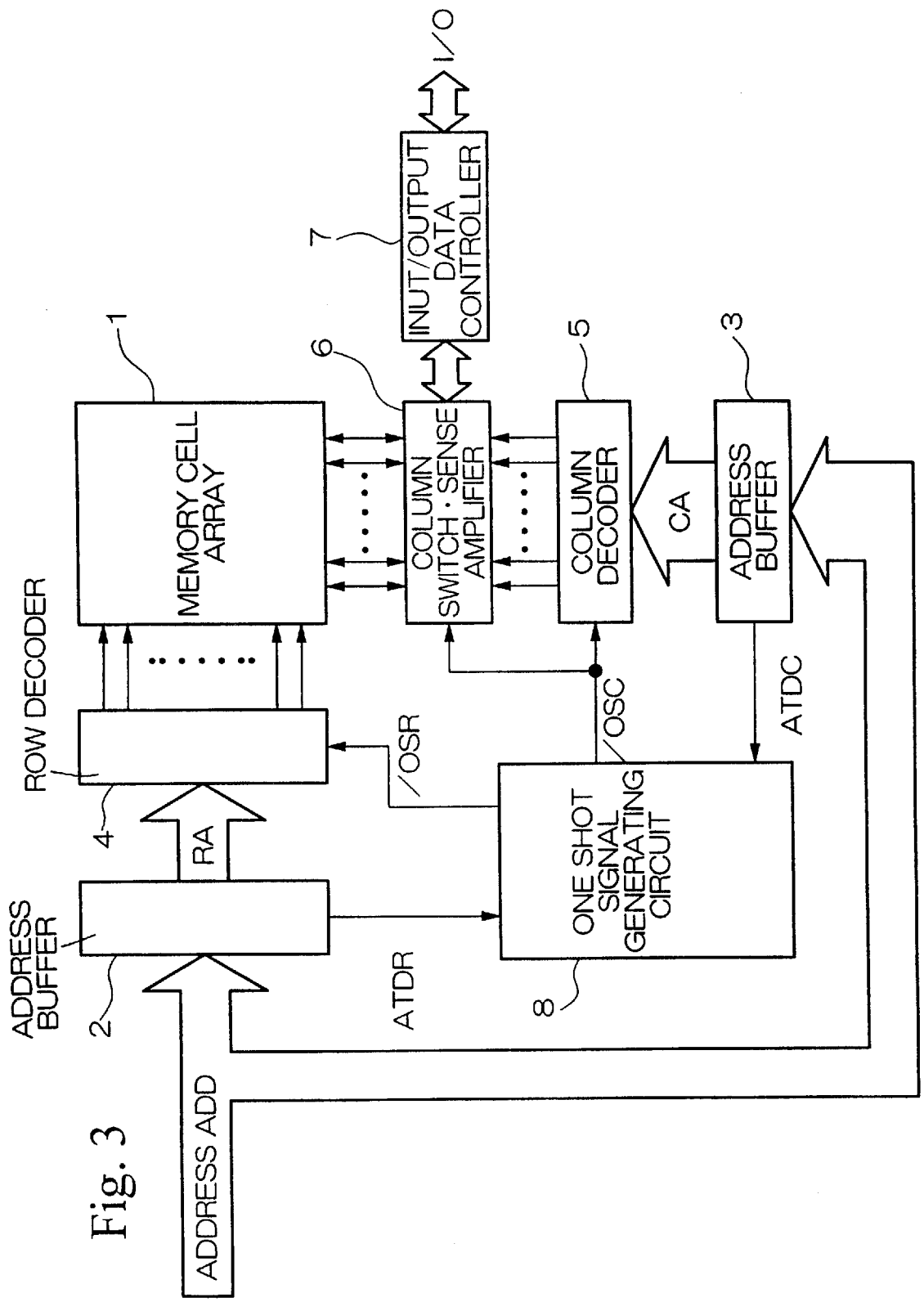
FIG. 3 is a block diagram of an SRAM which is an example of the design of a semiconductor device according to a third embodiment of the present invention.

FIG. 3 is block diagram showing the overall structure of a semiconductor device according to the present invention, and shows an example of the design of the SRAM to which the present invention is applied. In this figure, memory cell array 1 is of the typical form in which memory cells are disposed at the points of intersection between word lines which are in rows and bit lines which are in columns. Address ADD is an access address that is supplied from outside the SRAM, and includes the row address and column address.

Address buffer 2 buffers the row address that is included in address ADD and outputs the result as row address RA. Address buffer 3 buffers the column address that is included in address ADD and outputs the result as column address CA. In addition, address buffer 2 detects transformations in the row address at each bit, and outputs this detected result as an address transformation detection signal ATDC. Similarly, address buffer 3 detects transformations in the column address at every bit, and outputs the result of this detection as address transformation detection signal ATDC.

Row decoder 4 decodes row address RA, and activates one of the word lines, omitted from the figures. Column decoder 5 decodes column address CA and outputs a column selecting signal for selecting one of the bit line pairs, not shown in the figures. Column switch/sense amplifier 6 activates the sense amplifier corresponding to the bit line pair that was designated by the column selecting signal supplied from column decoder 5, and turns ON the column switch that is provided in between the sense amplifier and input/output data controller 7. As a result, the electric potential corresponding to the data held in the memory cell that is designated by address ADD is read out onto the selected bit line pair, and the sense amplifier inside column switch/sense amplifier 6 senses the potential of the bit line pair, amplifies it to either "H" or "L" level, and outputs it.

Input/output data controller 7 outputs the data output from the same sense amplifier as data I/O to a component that is external to the SRAM, sends data I/O supplied from outside the SRAM to column switch/sense amplifier 6, and finally writes this in memory cell array 1. One short signal generating circuit 8 generates one short signal OSR for determining the timing for operating row decoder 4 based on address transformation detection signal ATDR which is supplied from address buffer 2. Similarly, one short signal generating circuit 8 generates one short signal /OSC for determining the timing for operating column decoder 5 and column switch/ sense amplifier 6 based on the address transformation signal ATDC that is supplied from address buffer 3.

In this embodiment which has the design as described above, the present invention is applied to portions of the device excluding memory cell array 1. Accordingly, the detailed structure of each block shown in FIG. 3 will now be explained with reference to FIGS. 4~9. The same numeric symbols will be applied for the signals that are equivalent to those shown in FIGS. 1~3. In addition, the symbol [O] is added to the inside of the logic gates that are formed by low Vt transistors in the figure. The present invention can be applied to a given logic circuit inside the SRAM, however, in this case, the number of power cutting transistors increases. Accordingly, this is not desirable from the perspective of chip size or layout. In other words, since it is desirable to dispose as few power cutting transistors as possible, in this embodiment, low Vt transistors are disposed to those portions that would be greatly affected by an increase in the delay time.

<Address Buffer>

Figure 4:
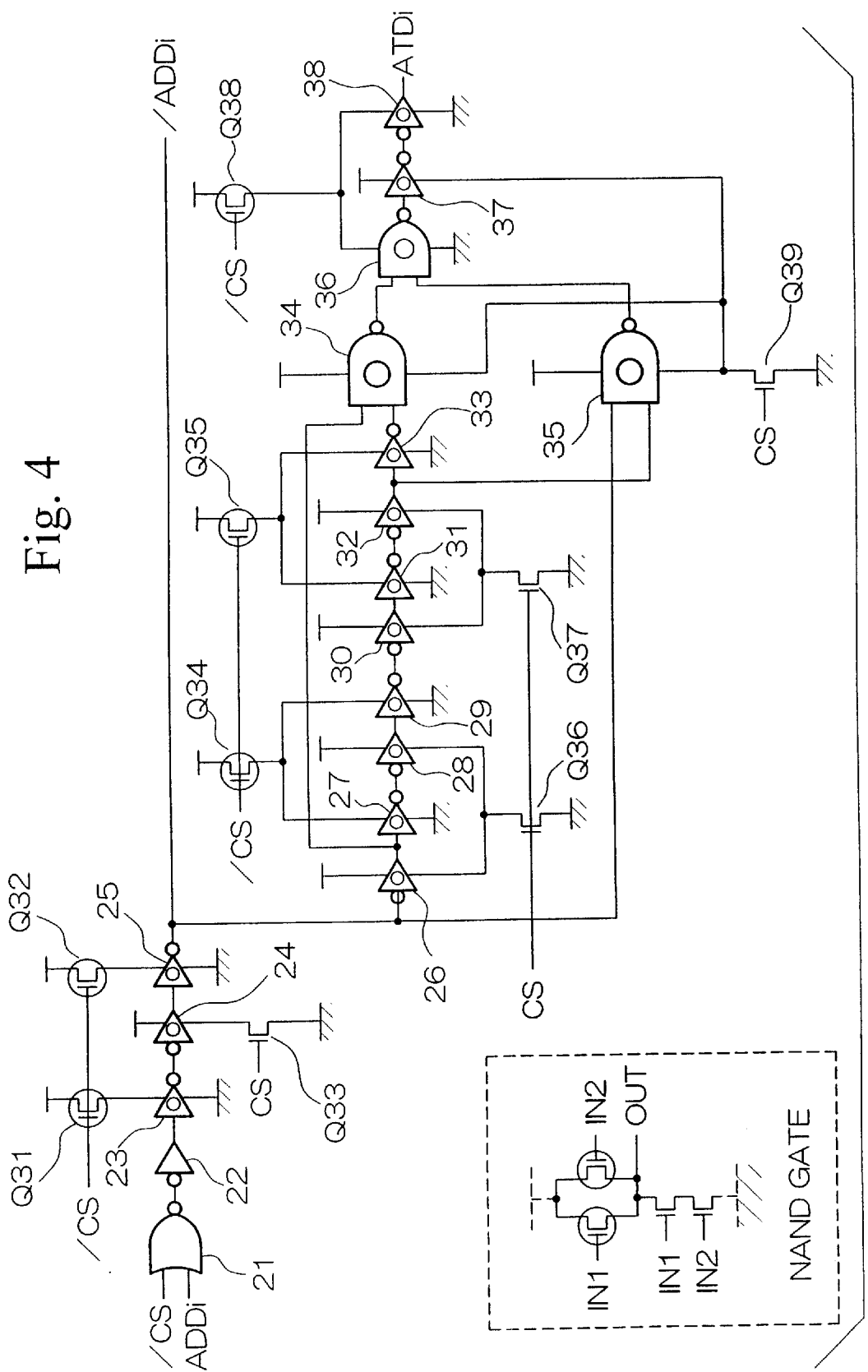
FIG. 4 is a circuit diagram showing the detailed structure of the address buffer in a semiconductor device according to this same embodiment.

FIG. 4 is a circuit diagram showing the detailed structure of address buffers 2,3. In this figure, address ADDi is a specific single bit that makes up address ADD shown in FIG. 3. All the bits have the same circuit structure. NOR gate 21 is for setting the input of inverter 22 at "L" level without respect to the value of address ADDi in the case where SRAM is in the standby state and chip selecting signal /CS is at "H" level.

NOR gate 21 inverts and outputs address ADDi when SRAM is in active state. A delay is applied to the output of this NOR gate 21 as it sequentially passes though inverter 22 and low voltage Vt inverters 23~25. The output of inverter 25 is output to a component external to the address buffer as address /ADDi. Address /ADDi corresponds to one of the bits in row address RA and column address CA shown in FIG. 3.

Next, address /ADDi is delayed further at low Vt inverters 26~33, and then supplied to one of the input terminals of low Vt NAND gate 34. From among these multiply connected inverters, the output from inverter 26 is extracted and supplied to the other input terminal of low Vt NAND gate 34, while the output of inverter 32 is extracted and supplied to the an input terminal of low Vt NAND gate 35. Address /ADDi is supplied without modification to the other input terminal of NAND gate 35.

By device of the preceding design, NAND gate 34 detects a rising transformation ("0"→"1") in address ADDi, and generates a pulse with the width of seven stages of the inverter. Further, NAND gate 35 detects a falling transformation ("1"→"0") in address ADDi, and generates a pulse with the width of seven stages of the inverter. Low Vt NAND gate 36 synthesizes both of these outputs by logic summing the outputs of NAND gates 34,35, and outputs the result to the external portion of the address buffer as address transformation detection signal ATDi after waveform shaping by buffering at low Vt inverters 37,38. This address transformation detection signal ATDi corresponds to one of the bits in the address transformation detection signals ATDR and ARDC shown in FIG. 3.

TrQ31~TrQ39 are all high Vt power cutting transistors, and are connected to the transistors that form the low Vt logic gates. For example, the drain terminal of TrQ31 is connected to the source terminal for the p-type transistor forming inverter 23, and the drain terminal for TrQ33 is connected to the source terminal for the n-type transistor forming inverter 24. In addition, of the two n-type transistors that are aligned in a column to form two-input NAND gate 35, TrQ39 is connected to the source terminal of the transistor that is disposed in the lower part of the figure. In addition, TrQ38 is connected to the source terminal that is shared by the two p-type transistors forming two-input NAND gate 36. Note that the circuit diagram for the NAND gate is shown in FIG. 4 for reference.

Most of the internal logic circuit is formed of low Vt transistors, so that the address buffer receives address ADD supplied from the outside of SRAM without modification. For example, the addition of noise or the like at inverters 23~25 which are near the input side could result in the input of a short-cycle short pulse. For this reason, a power cutting transistor is exclusively assigned for each inverter. On the other hand, for inverters 26~33, which are positioned at later stages than inverters 23~25, the noise component is reduced by the capacitance and resistance components as explained above. Thus, one power cutting transistor is provided for every two low Vt transistors. Furthermore, for NAND gates 34~36 and inverters 37~38 which are located at even later stages than inverters 26~33, one power cutting transistor is assigned for every three transistors. Note that NAND gate 36 is connected to two p-type transistors internally.

Next, in the standby state, the output of NOR gate 21 is fixed at "L" level, and the output of inverter 22 becomes "H" level. As a result, power cutting transistor TrQ31 is connected to the p-type transistor that forms inverter 23 at the next stage, so that it is cut-off. The same applies to inverters 24,25, with power cutting transistors provided to the n-type and p-type transistors respectively so that the levels are sequentially inverted. Inverters 26~33 are the same. Next, "H" and "L" levels are output to NAND gate 34 from inverters 26 and 33 respectively. One of the p-type transistors is turned ON as a result. A power cutting transistor is provided to the n-type transistor side of NAND gate 34 so that current flow can be stopped by cutting off one of the n-type transistors.

"L" and "H" levels are supplied to NAND gate 35 from inverters 25 and 32 respectively. As in the case of NAND gate 34, a power cutting transistor is provided to the n-type transistor side. In addition, since the output of NAND gates 34 and 35 are both at "H" level, all of the p-type transistors are cut off at NAND gate 36, and all of the n-type transistors enter the ON state. For this reason, a power cutting transistor is provided to NAND gate 36 on the p-type transistor side. In addition, the output of NAND gate 36 becomes "L" level, so that a power cutting transistor is provided to inverters 37 and 38 as shown in the figure. In addition, address transformation detecting signal ATDi is at "L" level at this time.

<Row Decoder, Column Decoder>

Figure 5:
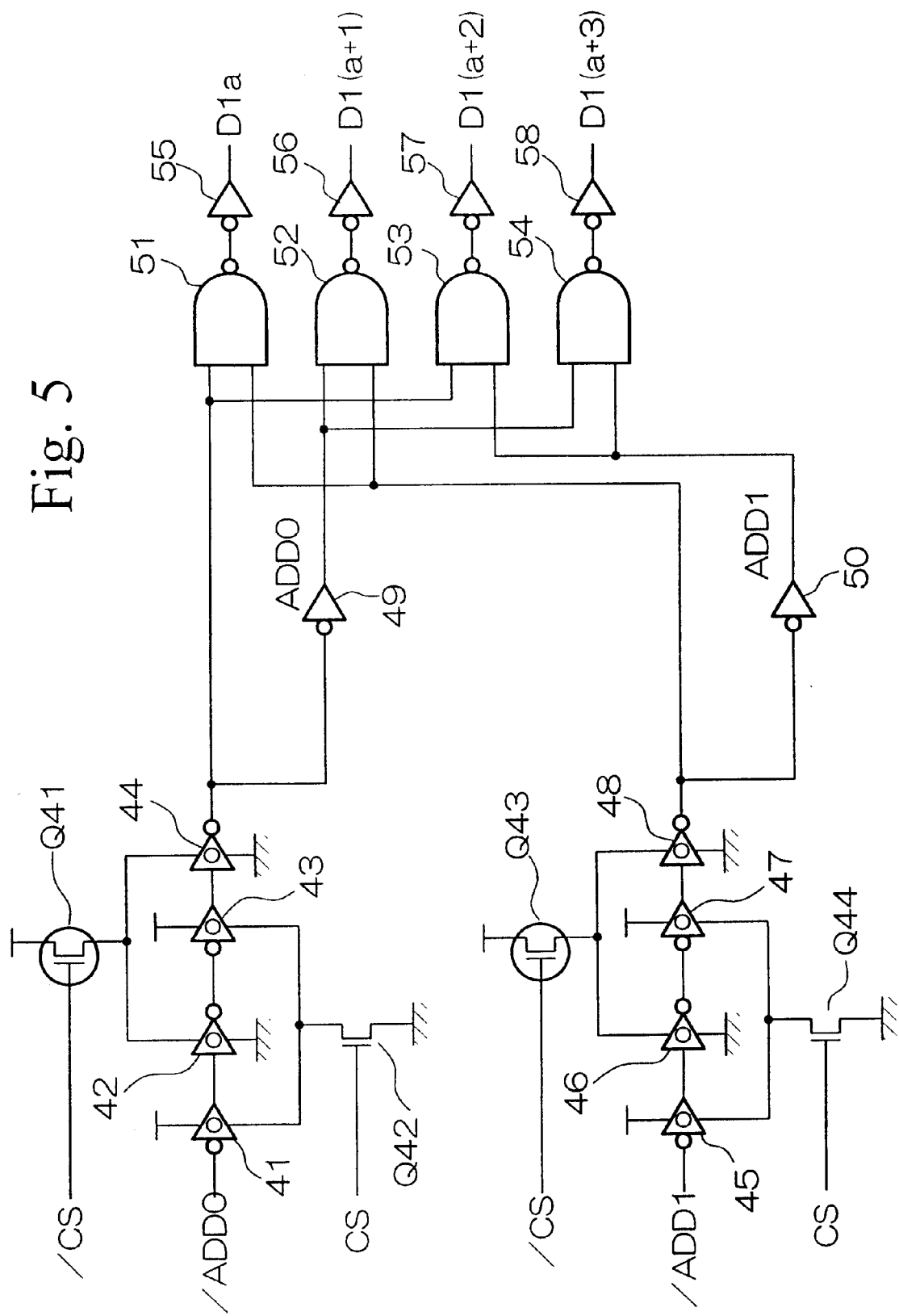
FIG. 5 is a circuit diagram showing the detailed structure of the predecoder portion of a row decoder/column decoder in the semiconductor device according to this embodiment.
Figure 6:
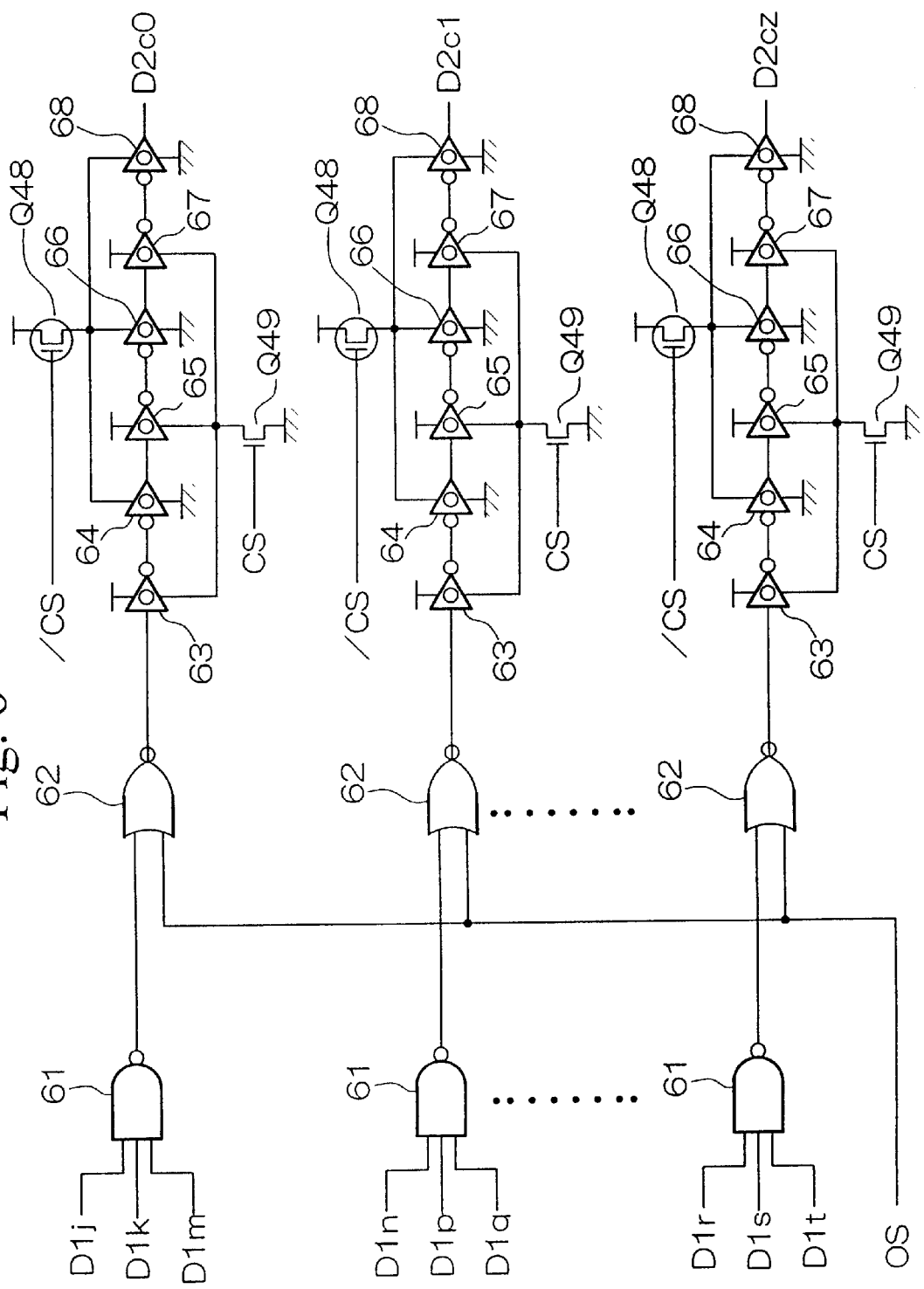
FIG. 6 is a circuit diagram showing the detailed structure of the main decoder portion of a row decoder/column decoder in the semiconductor device according to this embodiment.

FIGS. 5~6 are circuit diagrams showing the detailed structure of row decoder 4 and column decoder 5. The figures show the case where the number of bits in the address that is input to the decoder is small. These decoders are formed of a predecoder in the preceding stage which is shown in FIG. 5, and a main decoder in the subsequent step which is shown in FIG. 6. First, in FIG. 5, addresses /ADD0 and /ADD1 correspond respectively to bit 0 and bit 1 from among the bits forming row address RA and column address CA. These two bits are decoded, to generate a four bit decoded signal D1a~D1(a+3).

Low Vt inverters 41~44 delay address /ADD0, while low Vt inverters 45~48 delay address /ADD1. In addition, inverters 49 and 50 generate addresses ADD0 and ADD1 from addresses /ADD0 and ADD1 which have each been delayed. Based on these four types of addresses, NAND gates 51~54 and inverters 55~58 generate "H" level decoded signals D1a, D1(a+1), D1(a+2) and D1(a+3) when addresses ADD1 and ADD0 are "00", "01", "10" and "11".

Next, TrQ41~TrQ44 are power cutting transistors that are provided for low Vt inverters 41~48. As in the case of inverters 26~33 in FIG. 4 in which the same address /ADDi is input, one power cutting transistor is provided to each inverter. In the standby state, all addresses /ADDi become "L" level, so that a power cutting transistor is provided to the n-type transistor side of inverters 41 and 45. Other inverters that are low Vt follow in line with this.

Next, in FIG. 6, decoded signals D1j~D1t correspond to decoded signals D1a, etc. that are generated at the predecode circuit shown in FIG. 5. For example, decoded signals D1j, D1k, and D1m are the decoded results of bits 0,1 of address ADD, bits 2,3 of address ADD, and bits 4,5 of address ADD, respectively. NAND gate 61 obtains the logic sum of these decoded signals, and supplies it to NOR gate 62.

Next, one short signal OS is a signal which becomes "H" level when there is a transformation in any of the bits of address ADD, and corresponds to the inverted signal of one short signals /OSR and /OSC shown in FIG. 3. NOR gate 62 invalidates the decoded signal output from NAND gate 61 after a specific time period has elapsed since address ADD changed. This output is maintained at "L" level. Next, low Vt inverters 63~68 delay decoded signals output from NOR gate 62, and output the result as decoded signal D2co. Note that since multiple pairs of the above-described circuit structures are present, decoded signals D2c1 and D2cz are generated based on decoded signals D1n, D1p, and D1q and decoded signals D1r, D1s, and D1t respectively.

TrQ48 and TrQ49 are the power cutting transistors for the multiple stages of connected inverters. The main decoding circuit shown in FIG. 6 is positioned to a stage after the predecoding circuit shown in FIG. 5. Thus, as in the case of the output stage portion of the address buffer shown in FIG. 4, one power cutting transistor is assigned for every three inverters. As described above, in the standby state, all addresses /ADDi become "L" level. Accordingly, the output of NAND gates 51~54 is "H" level, and all decoded signals D1a, etc. are "L" level. Thus, the output of NAND gate 61 shown in FIG. 6 is "H" level and the output of NOR gate 62 is "L" level. Accordingly, a power cutting transistor is connected on the n-type transistor side of inverter 63. Inverters 64~68 follow in line with the preceding.

Figure 7:
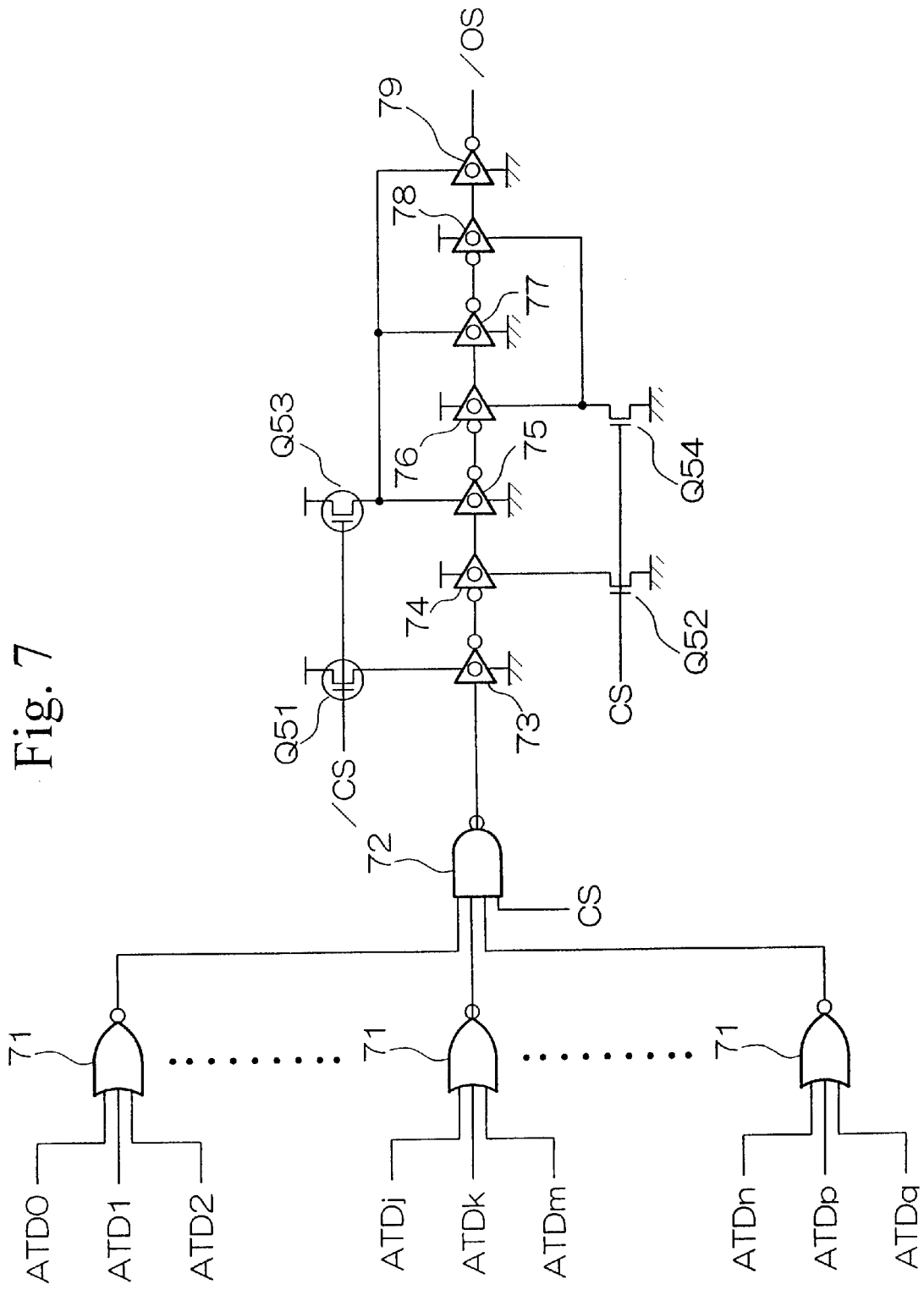
FIG. 7 is a circuit diagram showing the detailed structure of a one short signal generating circuit in the semiconductor device according to this embodiment.

Next, FIG. 7 is a circuit diagram showing the detailed structure of one short signal generating circuit 8. In this figure, NOR gate 71 synthesizes address transformation detection signals ATD0~ATD2 corresponding respectively to bits 0~2 of address ADD, and then inverts and outputs the signals. Other NOR gates 71 equivalent to the preceding are present in a number corresponding to the number of bits in address ADD. NAND gate 72 therefore obtains the logic sum of the output of these NOR gates 71, . . . 71 when the chip selecting signal CS at is "H" level in the active state, and outputs this result. In other words, if there is a change in any of the bits in address ADD so that any address transformation detection signal ATDi becomes "H" level, then the output of NAND gate 72 in the active state becomes "H" level. Further, by buffering the output of NAND gate 72, low Vt inverters 73~79 perform waveform shaping and then output one short signal /OS.

TrQ51~TrQ54 are power cutting transistors for inverters 73~79. Exclusive power cutting transistors are provided for inverters 73 and 74 which are near the output of NAND gate 72. This is because all of the address transformation detection signals ATDi are synthesized at NAND gate 72, so that the cycle of the signal output from NAND gate 72 will shorten to result in a short pulse if all of the bits of address ADD are skewed.

In order to reduce short pulses at inverters 75~79 which are positioned at later stages, each power cutting transistor is allotted two to three inverters. In the standby state, all of the address transformation detection signals ATDi become "L" level and all of the outputs from NOR gate 71 become "H" level. Since the chip selecting signal CS becomes "L" level, the output of NAND gate 72 effectively becomes "H" level. For this reason, at inverters 73~79, power cutting transistors are provided to one of the n-type/p-type transistors as shown in the figures. Note that since the output of NAND gate 72 is "H" level, the level of one short signal /OS in the standby state becomes "L" level.

<Column Switch/sense Amplifier>

Figure 8:
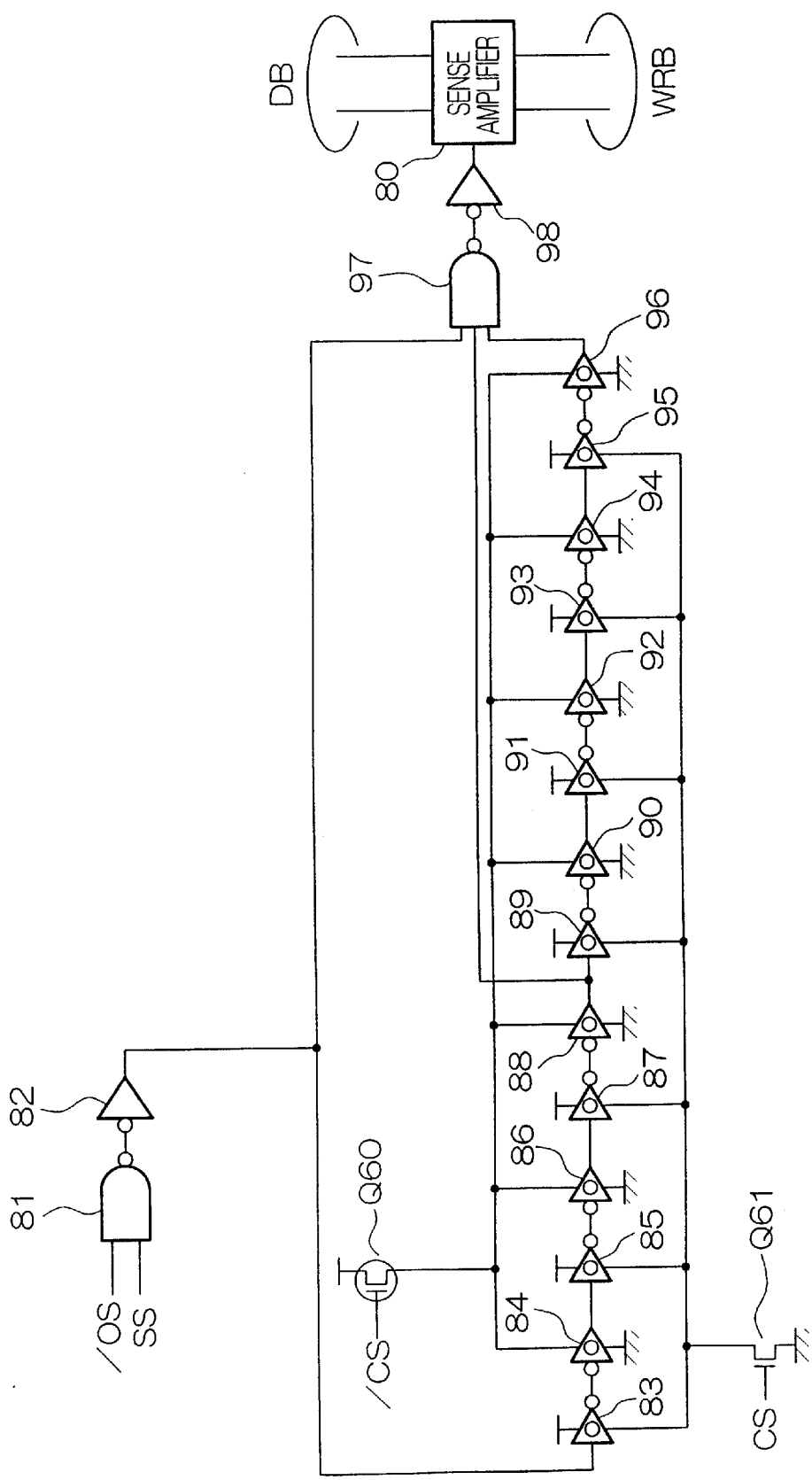
FIG. 8 is a circuit diagram showing the detailed structure of a column switch/sense amplifier in the semiconductor device according to this embodiment.

FIG. 8 is a circuit diagram showing the detailed structure of a portion of column switch/sense amplifier 6. The column switch and sense amplifier themselves are not particularly different from designs employed with the conventional SRAM. Accordingly, a figure of the column switch has been omitted here, while the sense amplifier is indicated simply by a block figure. In FIG. 8, symbol DB is a data base in which bit line pairs connected to memory cells are mutually connected via column switches not shown in the figure. The symbol WRB is an I/O (input/output) bus for sending and receiving read and write data between sense amplifier 80 and input/output data controller 7 shown in FIG. 3.

Symbol SS is a column selecting signal (and sense amplifier selecting signal) for activating sense amplifier 80 when the level of symbol SS is "H". Symbol SS corresponds to the output of column decoder 5 shown in FIG. 3. NAND gate 81 is for controlling the activation of sense amplifier 80 when one short signal OS becomes "L" level (one short signal /OS is "L" level) due to the reasons described above. Namely, NAND gate 81 restricts its output to "H" level regardless of the level of column selecting signal SS. Note that one short signal /OS corresponds to one short signal /OSC shown in FIG. 3. In addition, inverter 82 simply inverts the output of NAND gate 81.

Low Vt inverters 83~96 delay the output of inverters 82 and supply the result to NAND gate 97. In addition, the output of inverter 82 is directly input to NAND gate 97, as well as the output of inverter 88 which is at a midway point in the device. When column selecting signal SS is rising, one short signal /OS becomes "L" level, and controls the output of NAND gate 81 from becoming "L" level. Thereafter, once one short signal /OS has risen, the output of NAND gate 81 becomes "L" level so that the output of inverter 82 becomes "H" level. In addition, once the delay time corresponding to 14 stages of inverters has elapsed, the output of NAND gate 97 becomes "L" level. When column selecting signal SS falls thereafter, the output of NAND gate 97 becomes "H" level. Inverter 98 inverts the output of NAND gate 97, and supplies this result to sense amplifier 80 as a sense amplifier activating signal.

TrQ60 and TrQ61 are power cutting transistors. These two transistors are assigned all the low Vt inverters. Column selecting signal SS rises when sensing the memory cells and falls once the sensing operation is completed. For this reason, column selecting signal SS changes over a considerably long cycle as compared of address ADD. Thus, it is sufficient to assign one power cutting transistor for each of the n-type and p-type transistors. Note that one short signal /OS is fixed at "L" level in the standby state, so that the output of inverter 82 becomes "L" level. As a result, power cutting transistors are connected to inverters 83~96 as shown in the figures.

<Input/output Data Controller>

Figure 9:
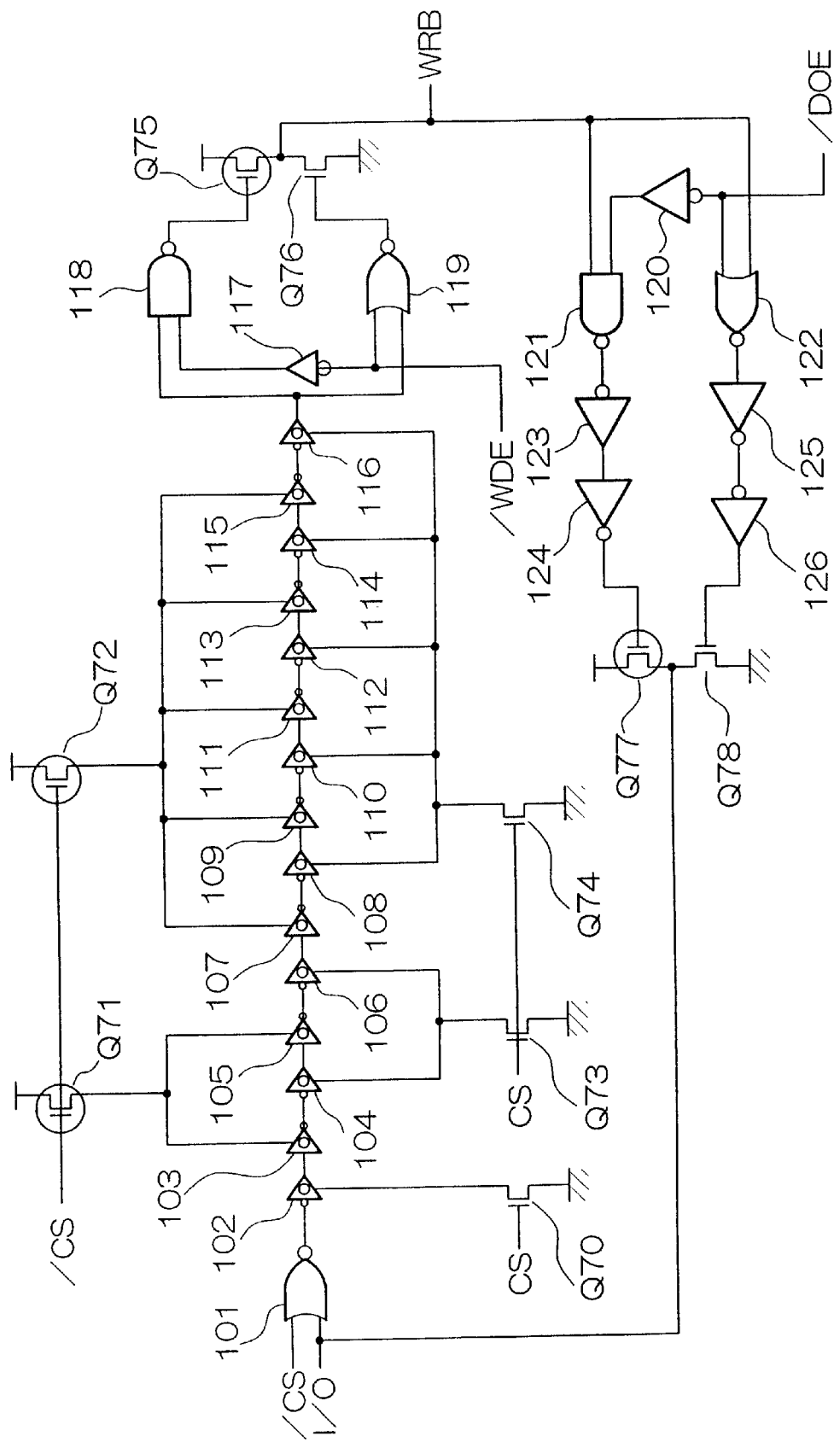
FIG. 9 is a circuit diagram showing the detailed structure of an input/output data controller in the semiconductor device according to this embodiment.
Figure 10:
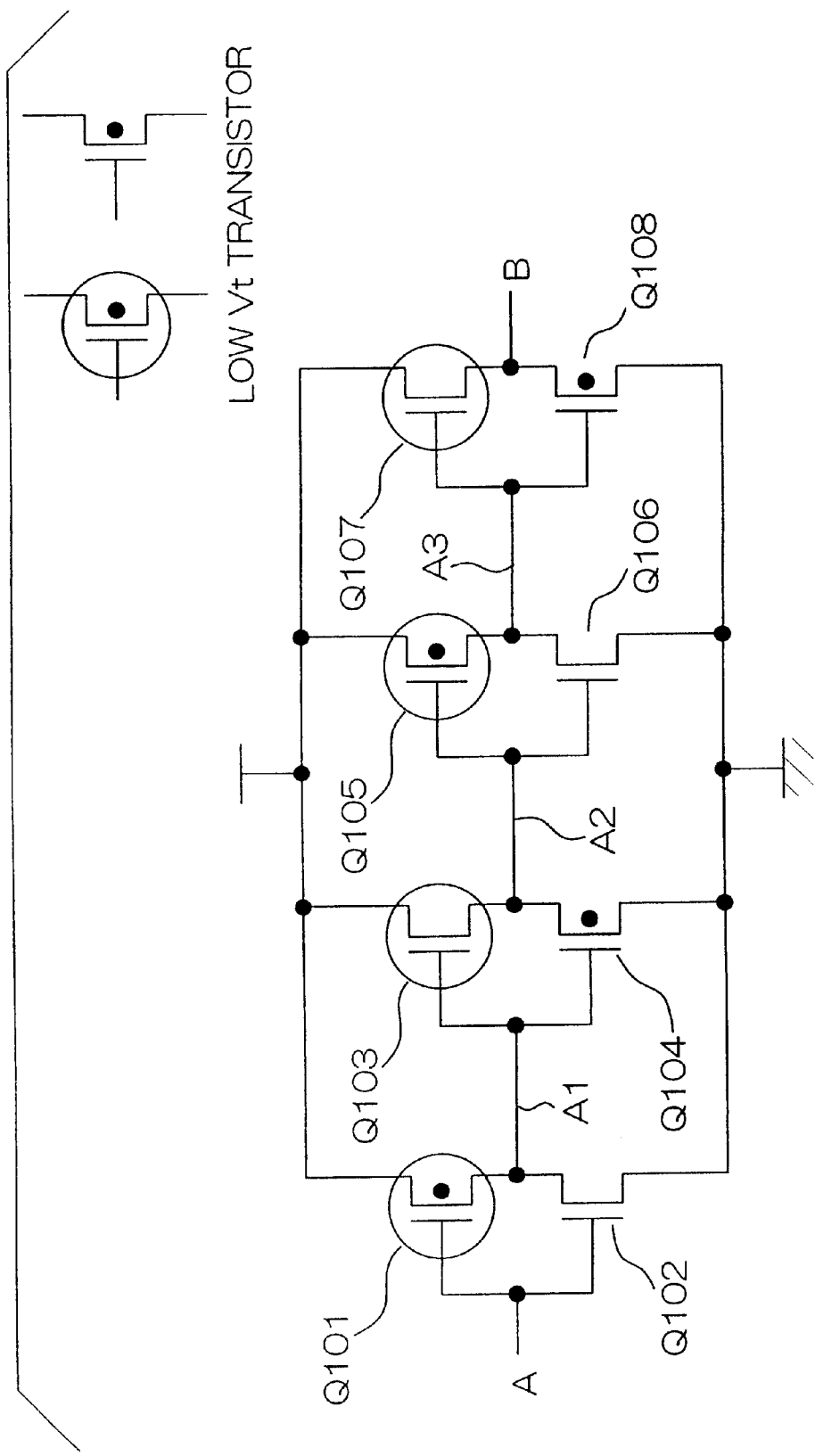
FIG. 10 is an example of the design of a semiconductor device according to the second example of the conventional art, and is a circuit diagram of a semiconductor device in which four stages of inverters are dependently connected.

FIG. 9 shows the detailed structure of input/output data controller 7, and is a circuit corresponding to one bit portion of data. In the figure, NOR gate 101 holds its output to "L" level regardless of data I/O when chip selecting signal /CS becomes "H" level in the standby state. Low Vt inverters 102~116 provide a delay to the output of NOR gate 101. TrQ70~TrQ74 are power cutting transistors for these inverters.

Write data is directly supplied from outside the SRAM to data I/O. In view of noise and other such short pulses, a power cutting transistor is provided for exclusive use with initial inverter 102. In the case of inverters 103~106 that are positioned after inverter 102, however, one power cutting transistor is allotted for every two inverters. Finally, in the case of inverters 107~116 which are at even later stages, just one power cutting transistor is disposed for the n-type and the p-type transistors respectively.

Write enable signal /WDE is a signal which becomes valid (i.e., "L" level) when writing to memory cell array 1. Inverter 117 inverts this signal and generates a write enable signal WDE. NAND gate 118 and NOR gate 119 drive TrQ75 and TrQ76 according to data I/O output from inverter 116 when write enable signal WDE, /WDE are valid. TrQ75 and TrQ76 supply data I/O to sense amplifier 80 via I/O bus WRB (see FIG. 8).

Data output enable signal DOE is a signal which becomes valid when reading out data from memory cell array 1. Inverter 120 inverts this signal and generates a data output enable signal DOE (not shown in the figures). NAND gate 121 and NOR gate 122 output inverted data from the data read out from sense amplifier 80 via I/O bus WRB when data output enable signal /DOE is valid. Inverters 123 and 124 delay the data that is output from NAND gate 121 and drive TrQ77. Similarly, inverters 125 and 126 delay the data output from NOR gate 122 and drive TrQ78. TrQ77 and TrQ78 output the data read out from memory cell array 1 as data I/O to a part external to SRAM.

As described above, in this embodiment, power cutting transistors are provided independently to each block shown in FIG. 3. In addition, the number of transistors allotted to a power cutting transistor is determined based on the cycle of the signal that is input to each block. This case takes into consideration the noise included in the signals input to each block and the skew between the input signals. In other words, the number of transistors allotted to each power cutting transistor is reduced for transistors that are disposed near the input stage. In addition, high frequency signals are eliminated to a greater degree as the signal progresses through subsequently later stages, due to the capacitance and resistance components that are present up through that point in the device. Thus, a greater number of transistors are allotted to each power cutting transistor as the output stage is approached. In this way, it is possible to optimally dispose the power cutting transistors.

This embodiment shows an example of the application of the present invention to an SRAM that was based on the first embodiment. However, it is of course possible to substitute a design based on the second embodiment rather than the first embodiment. In this case, buffers consisting of two stages of inverters are inserted in between the gate terminals of TrQ31 and TrQ32 and the gate terminals of TrQ34 and TrQ35 shown in FIG. 4.

In addition, this embodiment applied the present invention to all of the blocks shown in FIG. 3 with the exception of memory cell array 1. However, it is of course acceptable to apply the present invention to just a portion of these blocks.

As explained above, in the present invention, a plurality of power cutting transistors are provided respectively for each type of transistor (i.e., n-type and p-type transistors), these power cutting transistors blocking leak currents from those logic circuit transistors forming a logic circuit that cut off when the circuit is in the standby state. Further, a plurality of power cutting transistors are assigned by transistor type to the logic circuit transistor. As a result, the number of logic circuit transistors assigned to each power cutting transistor can be reduced. Accordingly, the lower the number of assigned transistors, the more possible it is to limit the increase in the delay time of the logic circuit which is caused by the simultaneous charge and discharge of these logic circuit transistors. In addition, the delay time can be held constant rather than depending on the width of the pulse that is input to the logic circuit. Further, since the threshold voltage of the logic circuit transistors is lowered, high speed operation using a low voltage source becomes possible. By providing power cutting transistors, it is possible to prevent sub-threshold current from flowing to logic circuit transistors that are cut off in the standby state. Accordingly, reduction in the current used can be anticipated. In addition, since only those logic circuit transistors that cut off in the standby state are connected to the power cutting transistor, the potential can be supplied from the logic circuit transistors that do not cut off in the standby state. Thus, the output of the gates inside the logic circuit does not become unstable.

In the invention according to the second aspect, the various power cutting transistors are assigned so that the number of logic circuit transistors charging and discharging simultaneously is a maximum of one. Thus, the increase in the delay time due to charging and discharging of logic circuit transistors can be minimized.

In the invention according to the third aspect, the logic circuit transistors that are assigned to each power cutting transistor are determined according to the minimum cycle during which an input signal can be taken up. As a result, it is possible to limit the increase in the delay time, even in the case of a logic circuit into which short-cycle, high frequency short pulses can be input. Conversely, the number of power cutting transistors can be decreased in a logic circuit into which long-cycle, low frequency signals are input. Thus, the surface area occupied by power cutting transistors in this area can be reduced, thereby realizing an optimal distribution for the power cutting transistors.

In the invention according to the fourth aspect, the assignment of power cutting transistors is carried out so that the minimum cycle during which an input signal can be taken up is greater than the delay time for the portion of the circuit assigned to a power cutting transistor. As a result, the number of logic circuit transistors that can be assigned to each power cutting transistor without increasing the delay time can be maximized. Accordingly, accompanying this reduction in the number of power cutting transistors, the area occupied by the power cutting transistors can be minimized.

In the invention according to the fifth aspect, the number of logic circuit transistors assigned per power cutting transistor is reduced as the output stage is approached, as compared to when near the input stage of the logic circuit. As a result, even in such cases as the addition of noise to an input signal, or the input of a data or address signal that is skewed between bits, it is possible to control the increase in the delay time while also reducing the number of power cutting transistors as much as possible. In other words, because the power cutting transistors are densely distributed near the input stage, there is no increase in the delay time due to short pulses. In addition, in the vicinity of the output stage, short pulses are eliminated by the capacitance and resistance components that are present from the input stage forward. Thus, the delay time is not affected even though the number of power cutting transistors has been decreased.

In the invention of the sixth aspect, a buffering device is inserted in between the power cutting transistors for buffering the chip selecting signal as the chip selecting signal is being distributed to each power cutting transistor. As a result, the load capacity of the chip selecting signal is reduced.

In the invention of the sixth aspect, a semiconductor device as disclosed in the first aspect is employed as the logic circuit forming the main parts within a semiconductor memory device, excluding the memory cell array. As a result, it is possible to realize an SRAM or other such semiconductor memory device having a small chip size that operates at high speed using a low voltage source and has a low current consumption even in the standby state.

What is claimed:

1. A semiconductor device provided with power cutting transistors for blocking leak currents from the logic circuit transistors forming a logic circuit that cut off when said circuit is in the standby state, in which the threshold voltage of said logic circuit transistors is lower than the threshold voltage of said power cutting transistors, wherein:

a plurality of said power cutting transistors is provided for each type of transistor, and several said power cutting transistors are assigned by transistor type for said transistors of said logic circuit.

2. A semiconductor device according to claim 1, wherein each of said power cutting transistors is assigned to each part of the circuit so that the number of said logic circuit transistors charging and discharging simultaneously is a maximum of one.

3. A semiconductor device according to claim 1, wherein one to a plurality of said logic circuit transistors that are assigned to each said power cutting transistor is determined according to the minimum cycle during which an input signal supplied to said logic circuit can be taken up.

4. A semiconductor device according to claim 3, wherein the portion of the circuit that is formed of said one to a plurality of logic circuit transistors that are assigned to each said power cutting transistor is determined so that the delay time Td for said portion of the circuit satisfies Tcyc≧Td, where Tcycle is the minimum cycle for obtaining said input signal.

5. A semiconductor device according to claims 1, wherein the number of said logic circuit transistors assigned per said power cutting transistor is reduced as the output stage is approached, as compared to when near the input stage of said logic circuit.

6. A semiconductor device according to claims 1, wherein
said power cutting transistors are turned ON and OFF together according to a chip selecting signal for setting said logic circuit to the active state or the standby state, and a buffering device is inserted in between said power cutting transistors for buffering said chip selecting signal as said chip selecting signal is being distributed to each said power cutting transistor.

7. A semiconductor device according to claims 1, wherein said semiconductor device recording data in memory cells that form a memory cell array comprises:

a buffering device for buffering an address signal input from the outside;

a row decoding device for decoding the row addresses included in said address signal and activating a word line in said memory cell array, while also detecting a transformation in said row address, and outputting a row address transformation detecting signal;

a column decoding device for decoding a column address included in said address signal and generating a selecting signal for the bit line in said memory cell array, while also detecting a transformation in said column address and outputting a column address transformation detecting signal;

a sensing device for sensing the electric potential which is generated by reading out on said bit line the data in the memory cell that is designated by said address signal, and outputting said data;

an input/output data controlling device for giving and receiving said data between said sensing device and the outside; and a timing signal generating device for generating a timing signal for operating said row decoding device, said column decoding device and said sensing device, based on said row address transformation detecting signal and said column address transformation detecting signal; and wherein at least one of said device is formed of a semiconductor device according to claims 1.

* * * * *